US009324439B1

(12) United States Patent
Chen et al.

(10) Patent No.: US 9,324,439 B1
(45) Date of Patent: Apr. 26, 2016

(54) WEAK ERASE AFTER PROGRAMMING TO IMPROVE DATA RETENTION IN CHARGE-TRAPPING MEMORY

(71) Applicant: SanDisk Technologies Inc., Plano, TX (US)

(72) Inventors: Hong-Yan Chen, Sunnyvale, CA (US); Yingda Dong, San Jose, CA (US); Ching-Huang Lu, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/518,340

(22) Filed: Oct. 20, 2014

(51) Int. Cl.
*G11C 16/34* (2006.01)
*G11C 16/14* (2006.01)
*G11C 16/04* (2006.01)

(52) U.S. Cl.
CPC ............ *G11C 16/14* (2013.01); *G11C 16/0466* (2013.01); *G11C 16/0483* (2013.01); *G11C 16/3404* (2013.01); *G11C 16/3409* (2013.01); *G11C 16/3413* (2013.01)

(58) Field of Classification Search
CPC ........... G11C 16/3404; G11C 16/3413; G11C 16/3409
USPC ........................................ 365/185.11, 185.18
See application file for complete search history.

(56) References Cited

U.S. PATENT DOCUMENTS

| 6,490,205 | B1 | 12/2002 | Wang et al. | |
|---|---|---|---|---|
| 6,744,675 | B1 | 6/2004 | Zheng et al. | |
| 7,075,828 | B2 | 7/2006 | Lue et al. | |
| 7,164,603 | B2 * | 1/2007 | Shih ................... | G11C 11/5621 365/185.18 |
| 7,170,795 | B2 | 1/2007 | Lee | |
| 7,408,810 | B2 * | 8/2008 | Aritome ............. | G11C 16/0483 365/185.17 |
| 7,580,286 | B2 * | 8/2009 | Yip ..................... | G11C 16/0483 365/185.17 |
| 7,746,715 | B2 * | 6/2010 | Van Duuren .......... | G11C 16/16 365/185.11 |
| 8,681,551 | B2 | 3/2014 | Maejima | |
| 2005/0237801 | A1 * | 10/2005 | Shih ....................... | G11C 16/06 365/185.11 |
| 2005/0281085 | A1 * | 12/2005 | Wu ..................... | G11C 11/5671 365/185.19 |
| 2007/0217263 | A1 | 9/2007 | Fasoli et al. | |
| 2007/0258289 | A1 * | 11/2007 | Lue .................... | G11C 16/0466 365/185.18 |
| 2008/0175046 | A1 | 7/2008 | Kuo et al. | |
| 2009/0055577 | A1 | 2/2009 | Moon et al. | |
| 2009/0086538 | A1 | 4/2009 | Jenne et al. | |

(Continued)

OTHER PUBLICATIONS

U.S. Appl. No. 14/472,889, filed Aug. 29, 2014.

(Continued)

*Primary Examiner* — Hoai V Ho
*Assistant Examiner* — Roberto Mancera
(74) *Attorney, Agent, or Firm* — Vierra Magen Marcus LLP

(57) ABSTRACT

Techniques are provided to improve long term data retention in a charge-trapping memory device. In addition to a primary charge-trapping layer in which most charges are stored, the memory device may include a tunneling layer comprising an engineered tunneling barrier such as oxide-nitride-oxide. The nitride in the tunneling layer may also store some charges after programming. After the programming, a data retention operation is performed which de-traps some electrons from the tunneling layer, in addition to injecting holes into the tunneling layer which form neutral electron-hole dipoles in place of electrons. These mechanisms tend to lower threshold voltage. Additionally, the data retention operation redistributes the electrons and the holes inside the charge-trapping layer, resulting in an increase in threshold voltage which roughly cancels out the decrease when the data retention operation is optimized.

21 Claims, 19 Drawing Sheets

---

Code in storage device (150)

boot code (151)

control code / set of instructions (160)

instructions to perform an erase operation for a set of memory cells by providing a negative gate-to-channel voltage for the memory cells (161)

instructions to perform a programming operation for a set of memory cells by providing a positive gate-to-channel voltage (162)

instructions to detect completion of the programming operation (163)

instructions to perform a data retention operation for the set of memory cells by providing a negative gate-to-channel voltage for the memory cells (164)

(56) References Cited

U.S. PATENT DOCUMENTS

| | | | |
|---|---|---|---|
| 2009/0114976 A1 | 5/2009 | Lue | |
| 2012/0206975 A1* | 8/2012 | Yang | G11C 16/16 |
| | | | 365/185.22 |
| 2013/0258780 A1* | 10/2013 | Khouri | G11C 16/0483 |
| | | | 365/185.17 |
| 2014/0112075 A1* | 4/2014 | Dunga | G11C 16/12 |
| | | | 365/185.17 |
| 2014/0153340 A1 | 6/2014 | Baek | |

OTHER PUBLICATIONS

U.S. Appl. No. 14/472,872, filed Aug. 29, 2014.
International Search Report & The Written Opinion of the International Searching Authority dated Jan. 7, 2016, International Application No. PCT/US2015/051279.

\* cited by examiner

Fig. 1C

Code in storage device (150)

boot code (151)

control code / set of instructions (160)

instructions to perform an erase operation for a set of memory cells by providing a negative gate-to-channel voltage for the memory cells (161)

instructions to perform a programming operation for a set of memory cells by providing a positive gate-to-channel voltage (162)

instructions to detect completion of the programming operation (163)

instructions to perform a data retention operation for the set of memory cells by providing a negative gate-to-channel voltage for the memory cells (164)

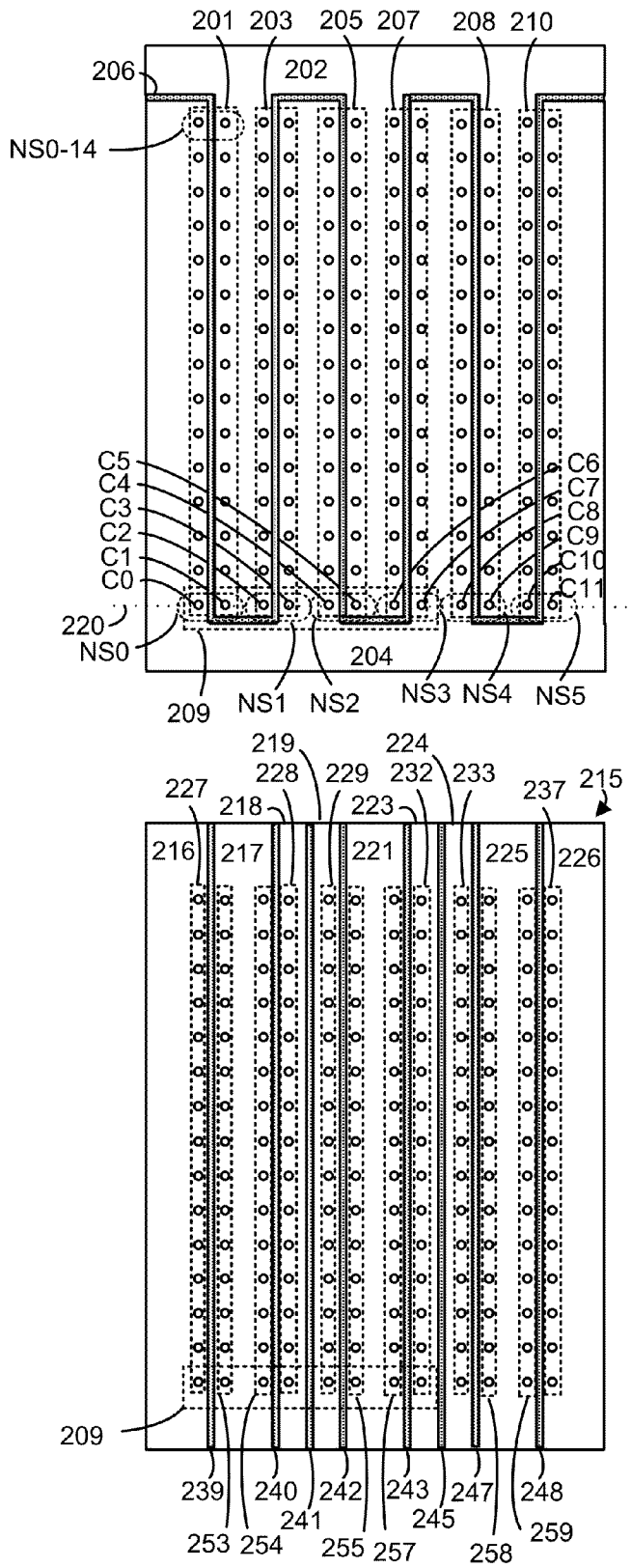

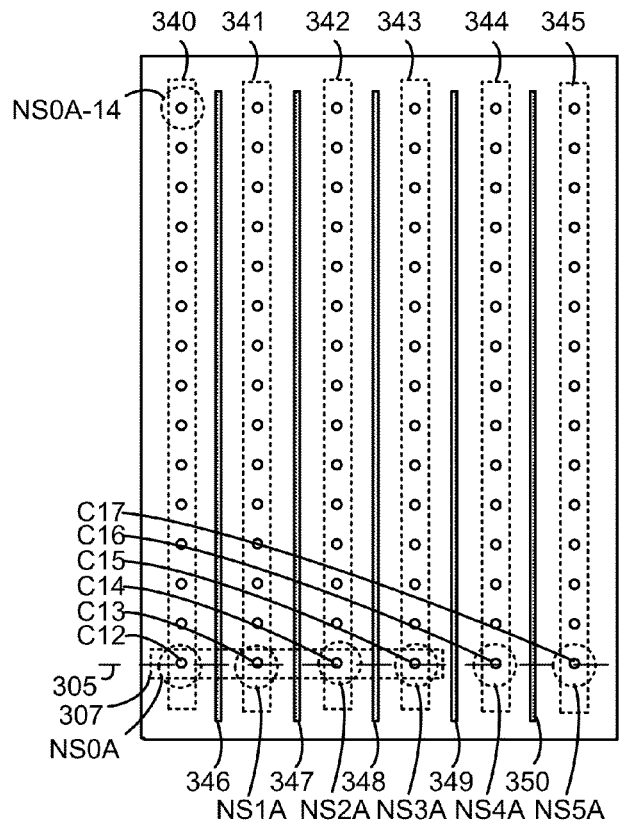
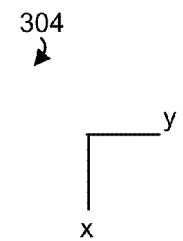
Fig. 3A
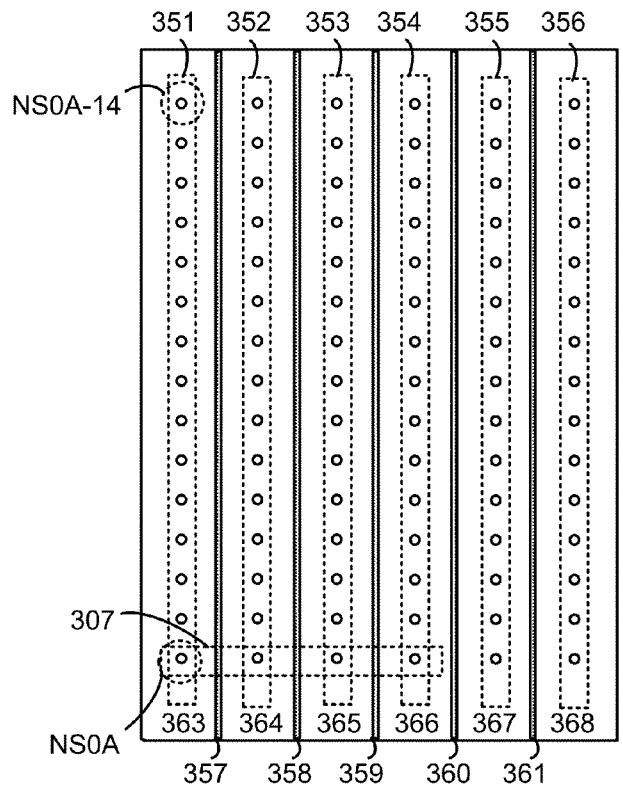
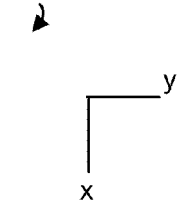
Fig. 3B

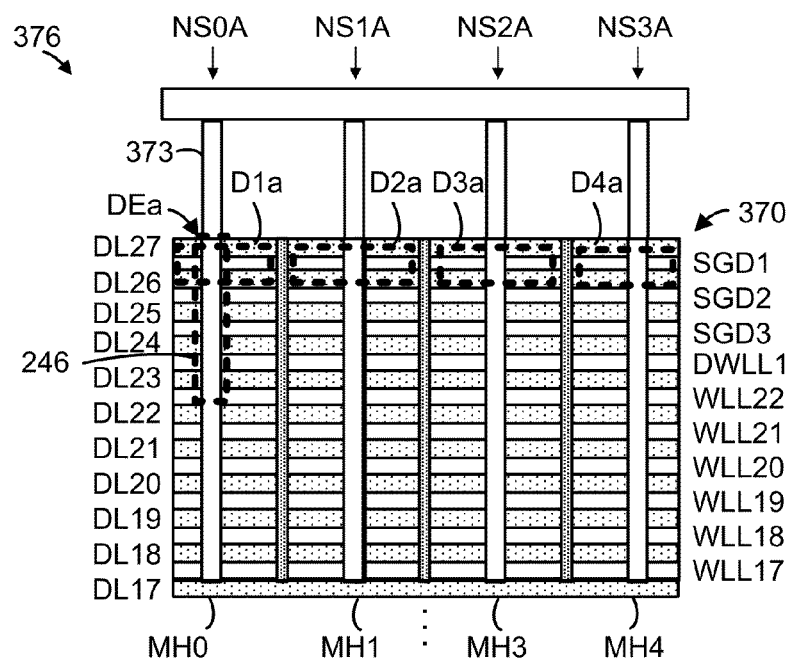
Fig. 3C1
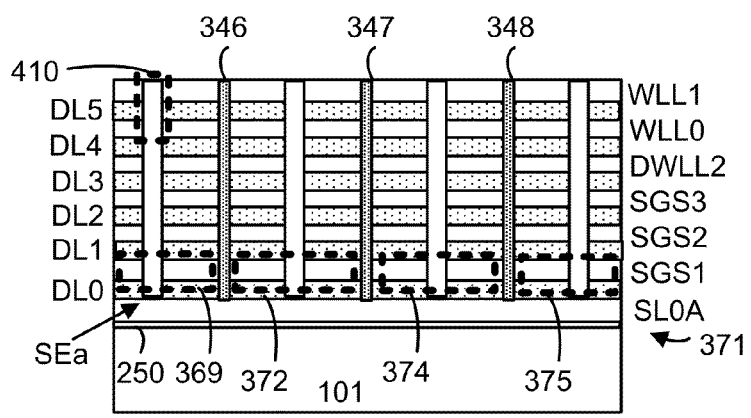
Fig. 3C2

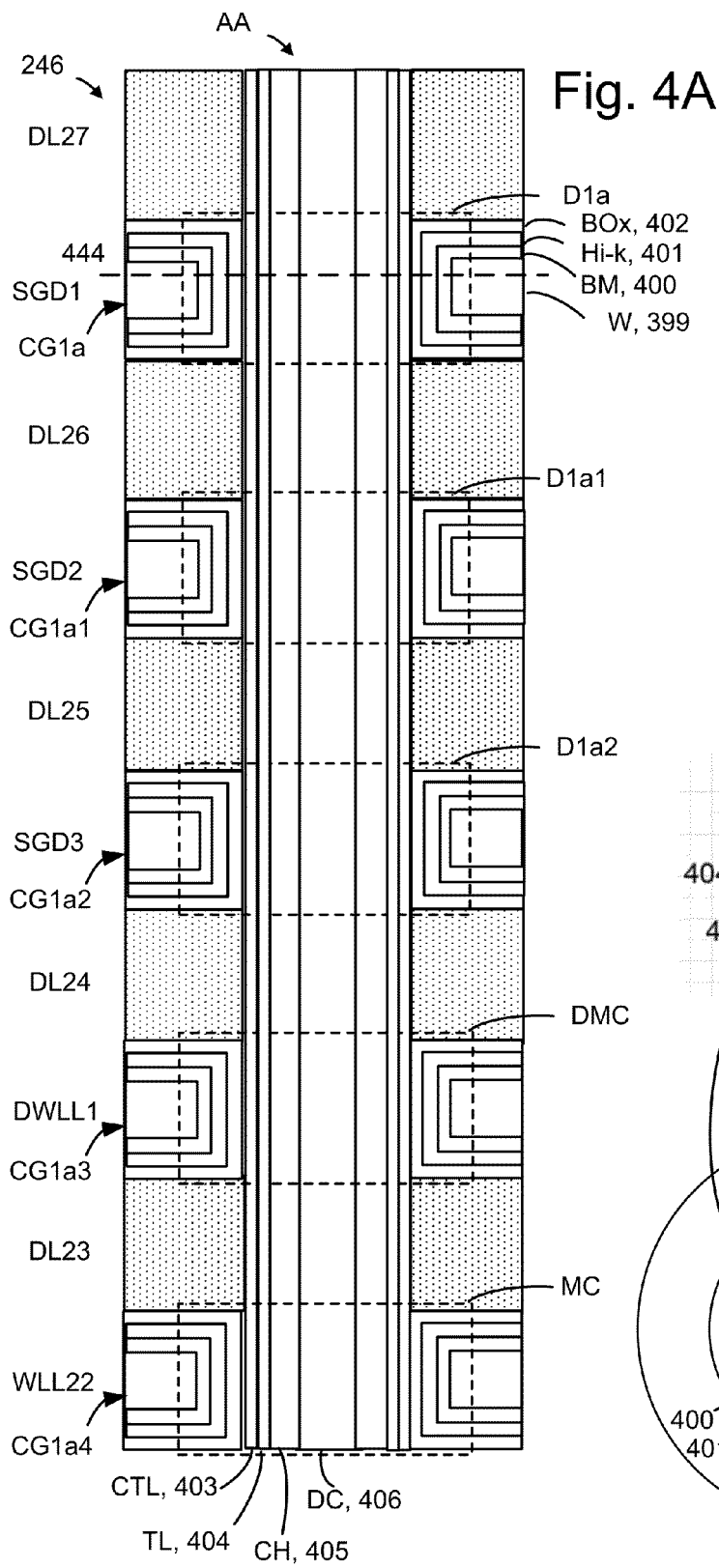
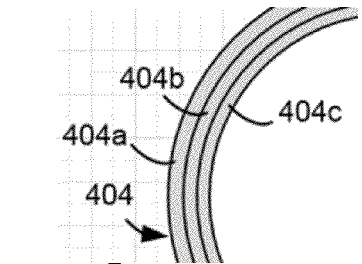
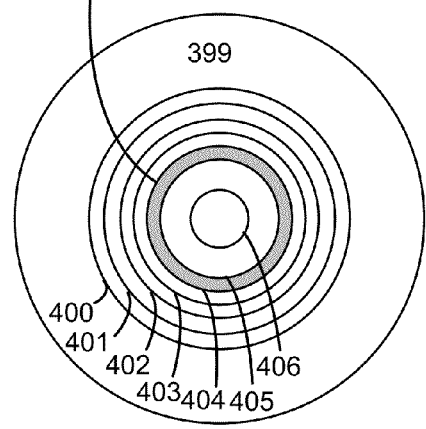
Fig. 4A
Fig. 4B1
Fig. 4B2

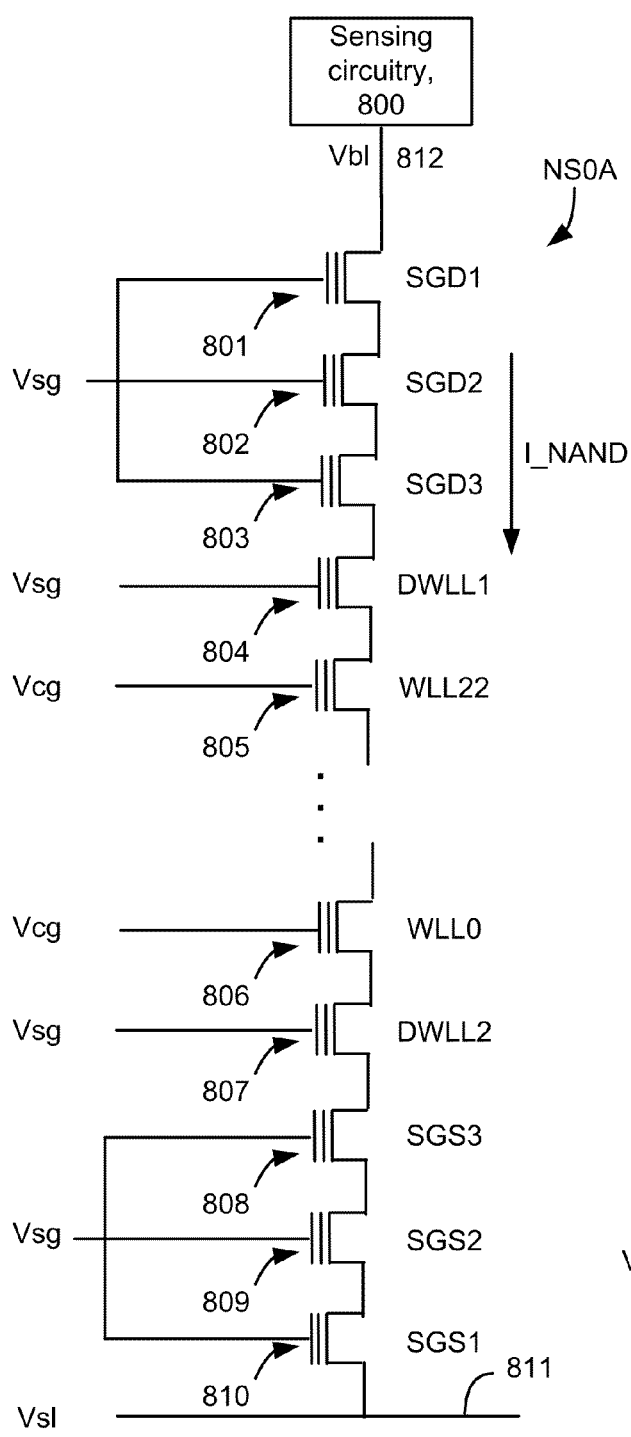
Fig. 8A
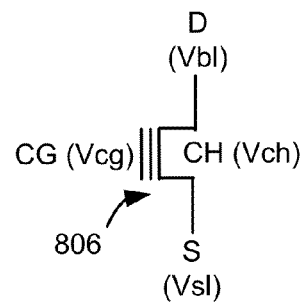
Fig. 8B1
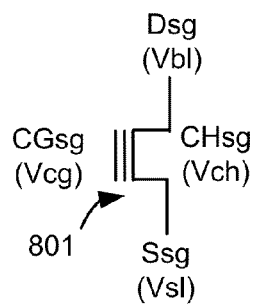
Fig. 8B2
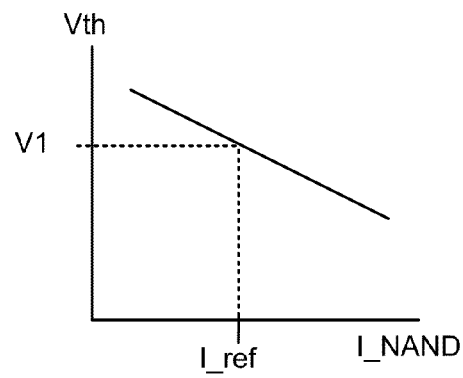
Fig. 8C

Fig. 9A1

| 3D memory erase operation – one sided | |
|---|---|
| Vcg | 0 V |
| Vbl | Verase1 (12-20 V) |
| Vsgd | Vsg_er (8 V) |
| Vch | float |
| Vsgs | 0 V |
| Vsl | 2 V |

Fig. 9A2

| 3D memory data retention operation – one sided | |
|---|---|
| Vcg | 0 V |
| Vbl | Ver_dr1 (10 V) |
| Vsgd | Vsg_dr (6 V) |
| Vch | float |
| Vsgs | 0 V |
| Vsl | 2 V |

Fig. 9B1

| 3D memory erase operation – two sided | |
|---|---|
| Vcg | 0 V |
| Vbl | Verase1 (12-20 V) |
| Vsgd | Vsg_er (8 V) |
| Vch | float |
| Vsgs | Vsg_er (8 V) |
| Vsl | Verase1 (12-20 V) |

Fig. 9B2

| 3D memory data retention operation – two sided | |
|---|---|
| Vcg | 0 V |
| Vbl | Ver_dr1 (10 V) |
| Vsgd | Vsg_dr (6 V) |
| Vch | float |
| Vsgs | Vsg_dr (10 V) |
| Vsl | Ver_dr1 (6 V) |

Fig. 9C1

| 2D memory erase operation | |
|---|---|
| Vcg | Verase2 (-5 to -10 V) |
| Vbl | 5 V |
| Vsgd | 7 V |
| Vch | 0 V |
| Vsgs | 2 V |
| Vsl | 0 V |

Fig. 9C2

| 2D memory data retention operation | |
|---|---|
| Vcg | Ver_dr2 (-5 V) |
| Vbl | 5 V |
| Vsgd | 7 V |
| Vch | 0 V |
| Vsgs | 2 V |
| Vsl | 0 V |

Fig. 9D

| 3D memory program operation | |
|---|---|
| Vcg | Vpgm (15-22 V) |
| Vbl | 0 V |
| Vsgd | 2 V |
| Vch | 0 V |
| Vsgs | 0 V |
| Vsl | 2 V |

Fig. 9E

| 2D memory program operation | |
|---|---|
| Vcg | Vpgm (10-15 V) |
| Vbl | 5 V |
| Vsgd | 7 V |
| Vch | float |
| Vsgs | 2 V |
| Vsl | 0 V |

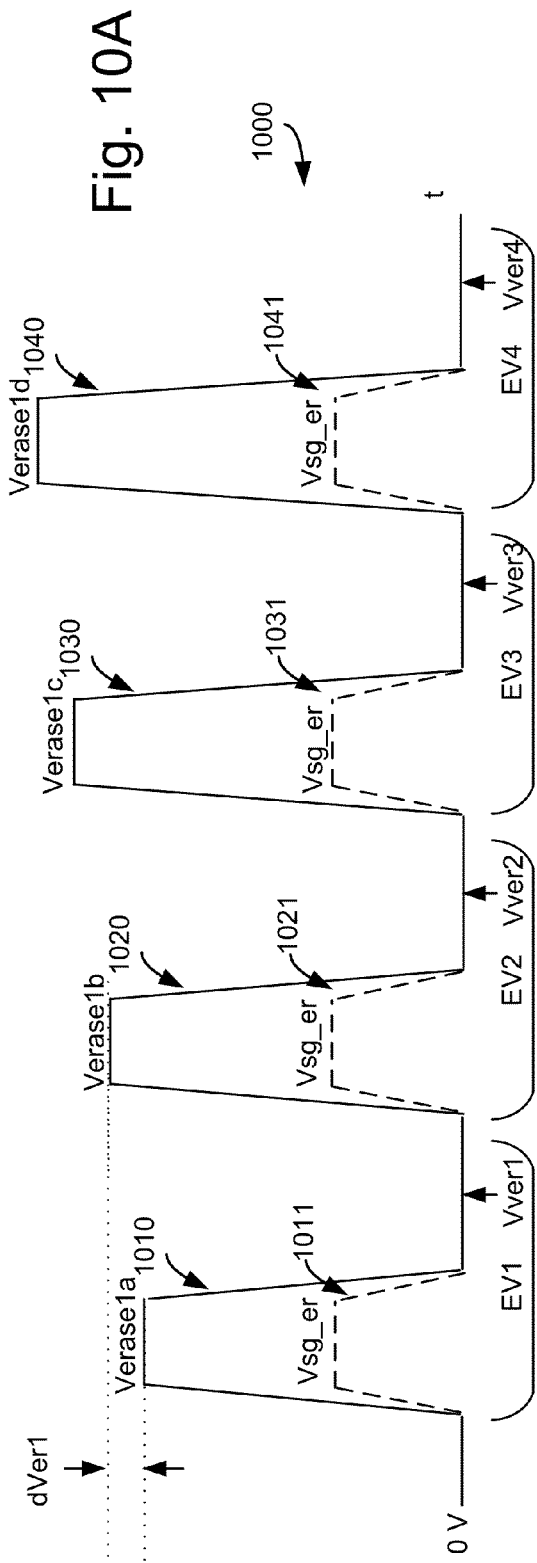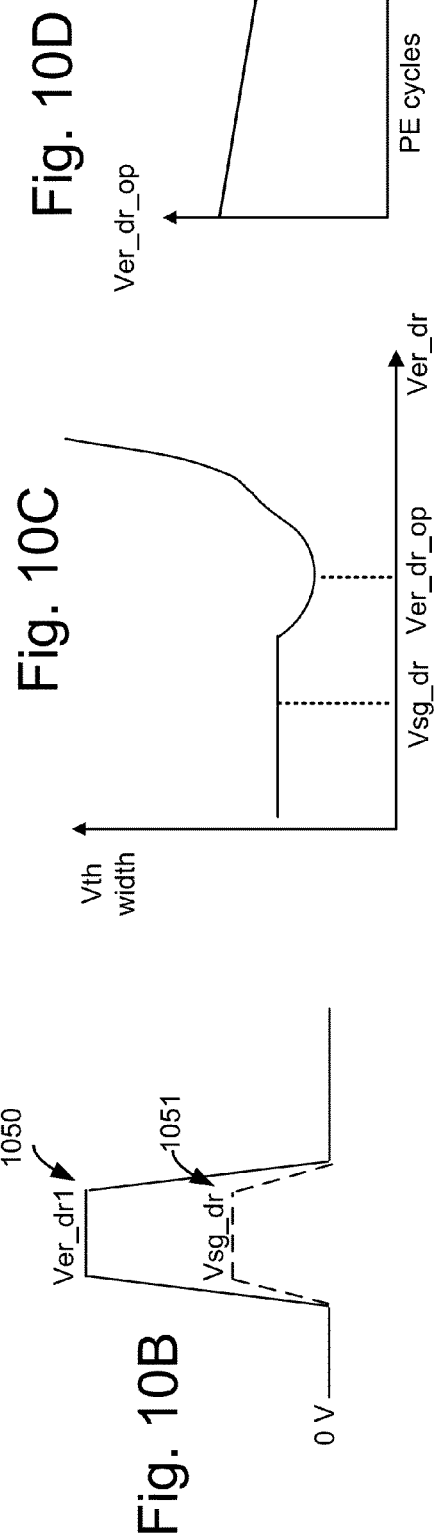

WEAK ERASE AFTER PROGRAMMING TO IMPROVE DATA RETENTION IN CHARGE-TRAPPING MEMORY

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 1C depicts code which may be executed by a processor.

FIG. 2A depicts a top view of example word line layers 202 and 204 in a U-shaped NAND embodiment, as an example implementation of BLK0 in FIG. 1A.

FIG. 2B depicts a top view of example select gate layer portions, consistent with FIG. 2A.

FIG. 3A depicts a top view of an example word line layer 304 of the block BLK0 of FIG. 1A, in a straight NAND string embodiment.

FIG. 3B depicts a top view of an example SGD layer 362, consistent with FIG. 3A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided.

FIG. 3C2 depicts a variation in the width of a memory hole along its height.

FIG. 4A depicts a view of the region 246 of FIG. 3C1, showing SGD transistors D1a (consistent with FIG. 3C1), D1a1 and D1a2 above a dummy memory cell (DMC) and a data-storing memory cell (MC).

FIG. 4B1 depicts a cross-section view of the region 246 of FIG. 4A along line 444.

FIG. 4B2 depicts a close-up view of the tunneling layer 404 of FIG. 4B1, showing an oxide 404a, nitride 404b, oxide 404c configuration.

FIG. 8A depicts a circuit diagram of a NAND string consistent with the memory devices of FIGS. 2C and 3C1.

FIG. 8B1 depicts a circuit diagram of the memory cell 806 of FIG. 8A.

FIG. 8B2 depicts a circuit diagram of the SGD transistor 801 of FIG. 8A.

FIG. 8C depicts a plot of Vth versus I_NAND, a current in a NAND string during a sensing operation, consistent with step 712 of FIG. 7C or step 722 of FIG. 7D.

FIG. 9A1 depicts a table of example voltages used in a one-sided erase operation for a 3D memory device.

FIG. 9A2 depicts a table of example voltages used in a one-sided data retention operation for a 3D memory device.

FIG. 9B1 depicts a table of example voltages used in a two-sided erase operation for a 3D memory device.

FIG. 9B2 depicts a table of example voltages used in a two-sided data retention operation for a 3D memory device.

FIG. 9C1 depicts a table of example voltages used in an erase operation for a 2D memory device.

FIG. 9C2 depicts a table of example voltages used in a data retention operation for a 2D memory device.

FIG. 9D depicts a table of example voltages used in a programming operation for a 3D memory device.

FIG. 9E depicts a table of example voltages used in a programming operation for a 2D memory device.

FIG. 10A depicts a waveform in an example erase operation which uses gate-induced drain leakage (GIDL) to charge up a channel, consistent with step 700 of FIG. 7A.

FIG. 10B depicts a waveform in an example data retention operation which uses GIDL to charge up a channel, consistent with step 705 of FIGS. 7A and 9A1 to 9B2.

FIG. 10C is a plot of a Vth width of a highest target data state on the vertical axis versus an erase voltage (Ver_dr) in a data retention operation on the horizontal axis, showing an optimum value (Ver_dr_op) of Ver_dr in FIG. 10B.

FIG. 10D is a plot of an optimum value (Ver_dr_op) in a data retention operation as a function of a number of program-erase (PE) cycles in a block of a memory device.

DETAILED DESCRIPTION

Figure 1A:
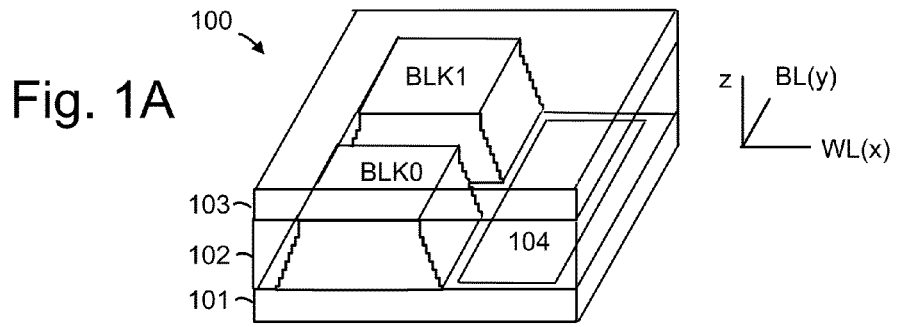
FIG. 1A is a perspective view of a 3D stacked non-volatile memory device.

Techniques are provided for reducing charge loss in charge-trapping memory.

A charge-trapping memory device may use a charge-trapping material such as silicon nitride layer which is separated from a channel layer by a tunneling layer. One example of a charge-trapping memory device is a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string. Some of the conductive layers are used as control gates for memory cells and other conductive layers are used as control gates for select gate transistors, such as drain or source side transistors in NAND strings. Another example of a charge-trapping memory device is a 2D memory device in which the charge-trapping layer extends horizontally along a NAND string.

Additionally, in some cases, the tunneling layer comprises an engineered tunneling barrier which is comprises of multiple layers such as oxide-nitride-oxide. Such a tunneling layer can provide a faster program and erase speed as well as a larger memory window and improved retention and endurance characteristics. Although the nitride is typically significantly thinner than the nitride of the charge trapping layer, some charges can be trapped in the nitride of the tunneling layer. Moreover, de-trapping of these electrons into the channel layer can result in long term data retention losses, e.g., over weeks, months or years. These losses can lead to a narrow threshold voltage (Vth) window and reduced reliability.

As a result of the charge loss, the Vth of a memory cell can decrease to the point where the target data state cannot be accurately read back. Generally, the charge loss causes a set of cells to have a widened Vth distribution which is downshifted below the verify voltages. This is in conflict with the need to provide narrow Vth distributions to allow multiple data states to be stored.

Techniques provided herein reduce the amount of charges stored in the nitride of the tunneling layer without significantly changing the Vth of a memory cell. In one aspect, the techniques include performing a data retention operation is performed after a programming operation involving an entire block, or a partial block, of memory cells. The data retention operation can be performed concurrently for all memory cells of a block so that the additional time used is a small fraction of the overall programming time. The data retention operation involves applying weak erase voltages to the memory cells, e.g., weaker than erase voltages used in a regular erase operation. The programming operation provides a positive gate-to-channel voltage for the memory cells, while the data retention operation provides a negative gate-to-channel voltage for the memory cells which is smaller in magnitude than a negative gate-to-channel voltage for the memory cells in a regular erase operation.

A weak erase pulse with an optimized magnitude which is applied after a programming operation can improve the long term data retention characteristic of a memory cell. The voltages used in the data retention operation can be optimized based on testing to optimize data retention. In one approach, the optimization occurs for a highest target data state which may be subject to the greatest amount of charge loss. For example, the largest erase voltage used in the data retention operation can be 30-70% of the largest erase voltage used in the regular erase operation. The specific voltages used depend on the erase operation. For example, one example erase operation applies an increasing voltage to a drain and/or source end of a NAND string and charges up a channel of the NAND string using GIDL while the channel voltage is floating. This type of operation can be used in a 3D memory device, for instance. Another example erase operation applies an increasingly negative voltage to a control gate of a word line while the channel is grounded. This type of operation can be used in a 2D memory device, for instance.

The voltages used in the data retention operation can also be optimized based on a number of program-erase cycles.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
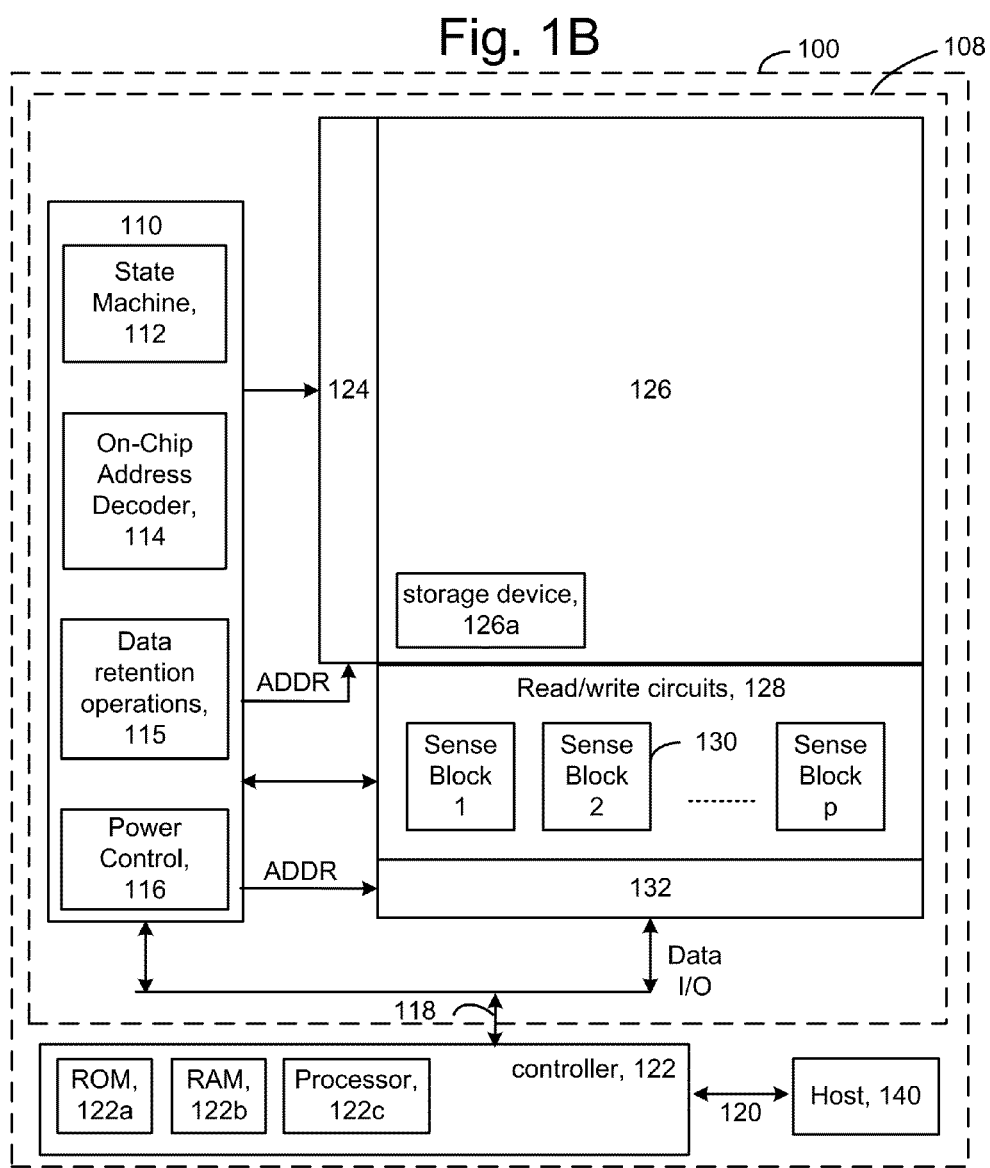
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via lines 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 115 may be provided for data retention voltages as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 1C depicts code which may be executed by the processor 122c. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The control code further includes instruct instructions to perform an erase operation for a set of memory cells by providing a negative gate-to-channel voltage for the memory cells (161), instructions to perform a programming operation for a set of memory cells by providing a positive gate-to-channel voltage for the memory cells (162), instructions to detect completion of the programming operation (163), and instructions to perform a data retention operation for the set of memory cells by providing a negative gate-to-channel voltage for the memory cells (164). The control code can include instructions to perform the functions described herein including the steps of the processes of FIG. 7A to 7D.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

Figure 2C:
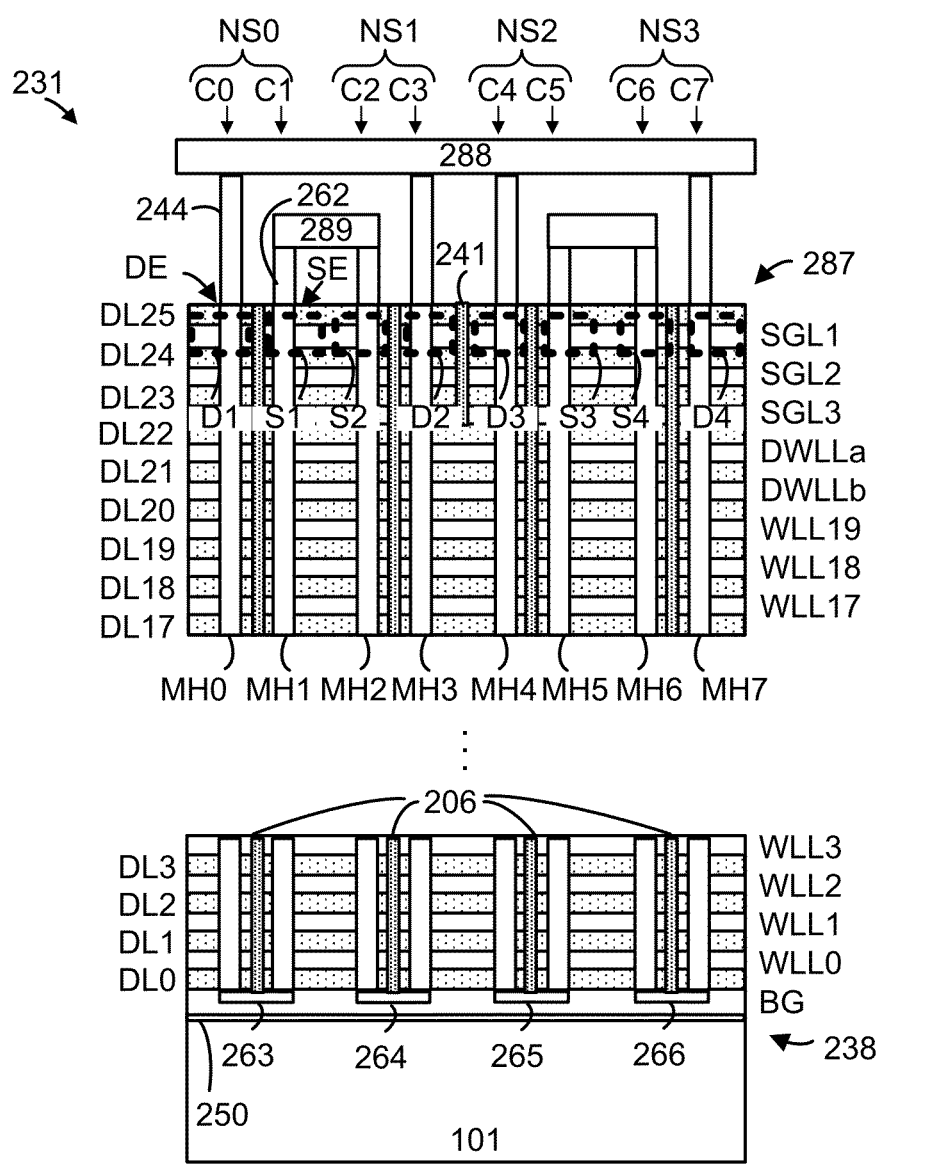
FIG. 2C depicts an embodiment of a stack 231 showing a cross-sectional view of the portion 209 of FIG. 2A, along line 220, where three select gate layers, SGL1, SGL2 and SGL3 are provided.

The view is of a representative layer among the multiple WLLs in a stack. Referring also to FIG. 2C, the stack includes alternating dielectric and conductive layers. The dielectric layers include DL0 to DL25 and may be made of $SiO_2$, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000× 24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD lines 216, 218, 219, 223, 224 and 226, respectively. Regions 253 and 254, 255 and 257, and 258 and 259 represent SGS transistors in SGS lines 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

Figure 2D:
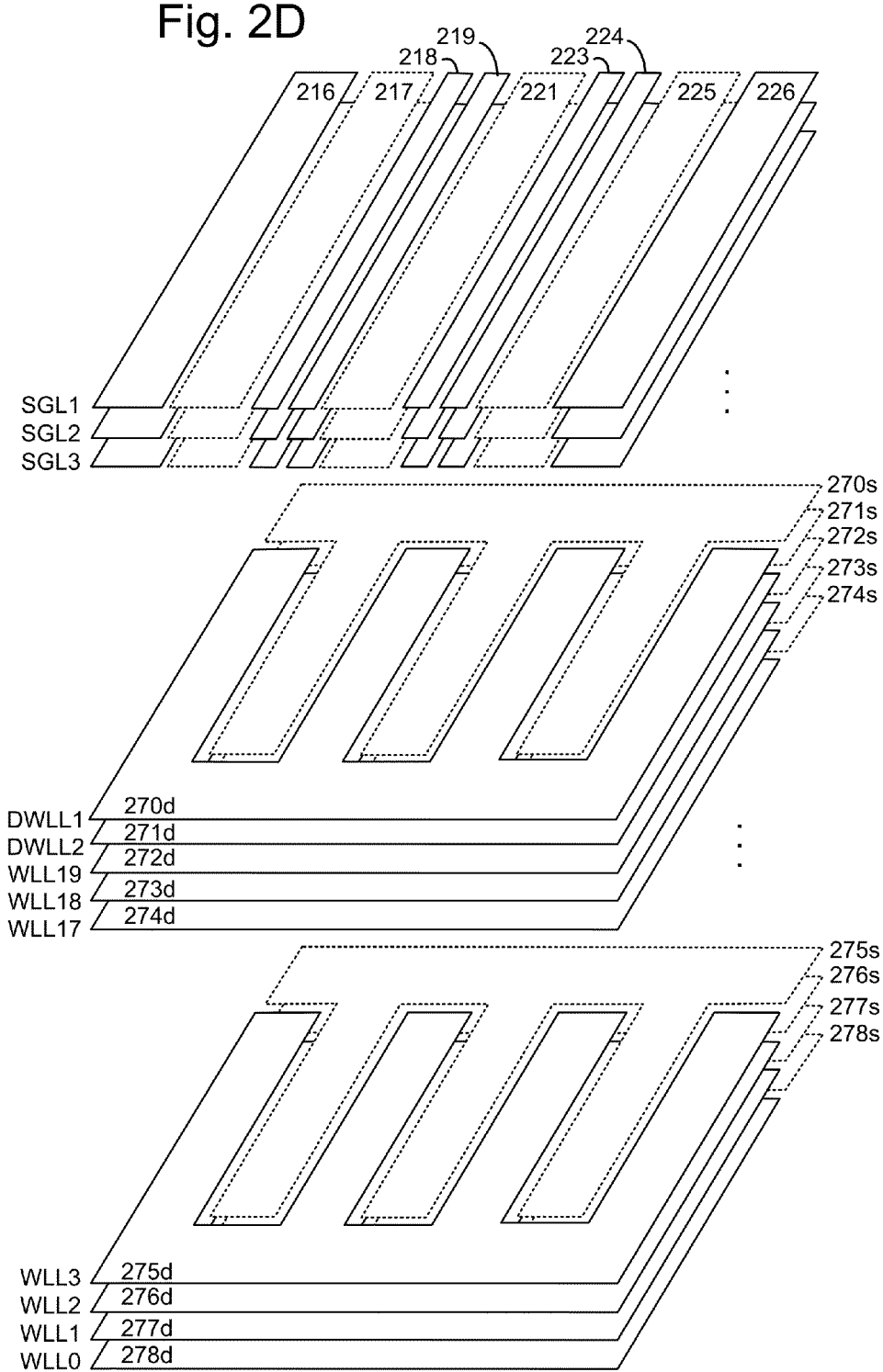
FIG. 2D depicts an alternative view of the select gate layers and word line layers of the stack 231 of FIG. 2C.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL19, WLL18 and WLL17 include drain-side word lines 270d, 271d, 272d, 273d and 274d, respectively, and source-side word lines 270s, 271s, 272s, 273s and 274s, respectively.

WLL3, WLL2, WLL1 and WLL0 include drain-side word lines 275d, 276d, 277d and 278d, respectively, and source-side word lines 275s, 276s, 277s and 278s, respectively. Each word line can be controlled independently, in one approach.

In an example programming operation, the source-side word line 272s is a first programmed word line and a drain-side word line 272d is a final programmed word line in a block.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

A region 246 of the stack is shown in greater detail in FIG. 4A.

Figure 4C:
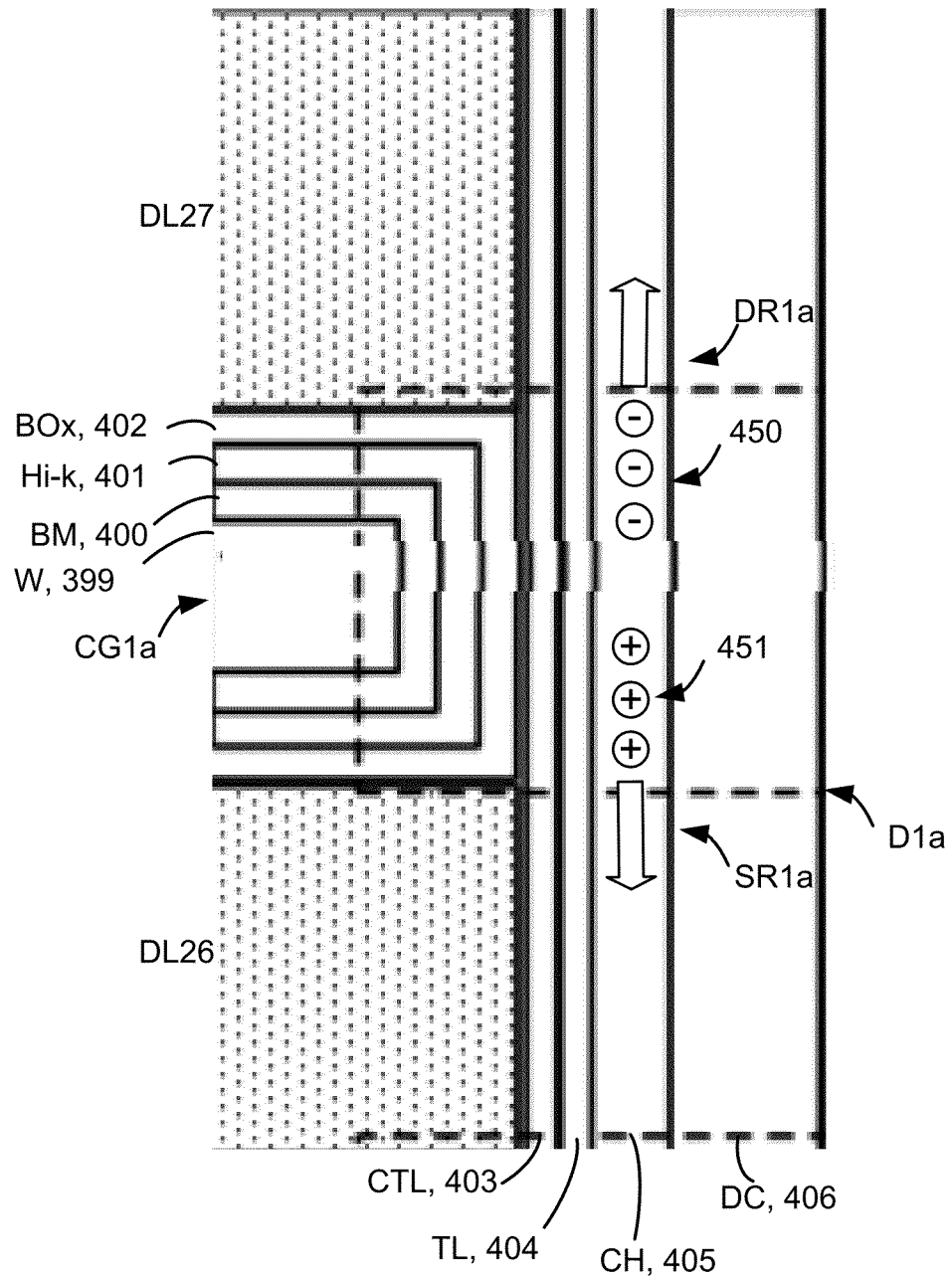
FIG. 4C depicts an expanded view of a portion of the SGD transistor D1a of FIG. 4A.
Figure 4D:
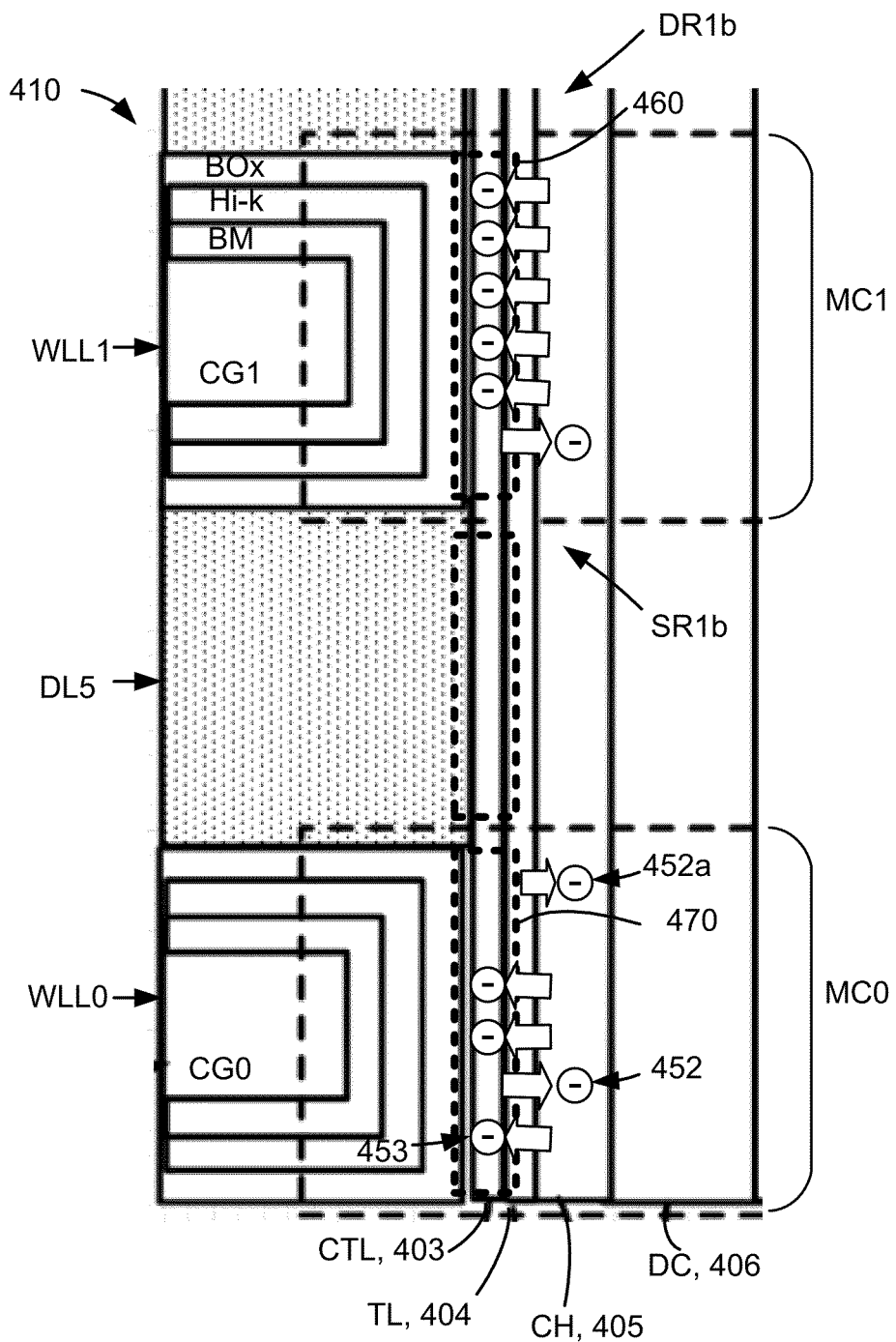
FIG. 4D depicts an expanded view of a region 410 of the NAND string of FIG. 3C2.

A region 410 of the stack is shown in greater detail in FIG. 4D.

Regions D1a, D2a, D3a and D4a represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunneling layer is stronger, so that the programming and erase speed is higher.

In this case, the memory cells are arranged along vertically-extending memory holes (MH0-MH7) in the memory device, a width of the vertically-extending memory holes varies along a height of the memory device, and a data retention operation is performed for a subset of the memory cells at a first range of heights in the memory device separately from a subset of the memory cells at a second ranges of height in the memory device. For example, in FIG. 3C1, the first range of heights can include WLL0-WLL10, where the width is relatively small, and the second range of heights can include WLL11-WLL22 where the width is relatively large. A first data retention operation can be performed concurrently for the memory cells of the first range of heights and then a second data retention operation can be performed concurrently for the memory cells of the second range of heights, for instance. Moreover, the first data retention operation can use relatively weaker erase voltages than second data retention operation due to the narrower width of the memory hole.

Figure 3D:
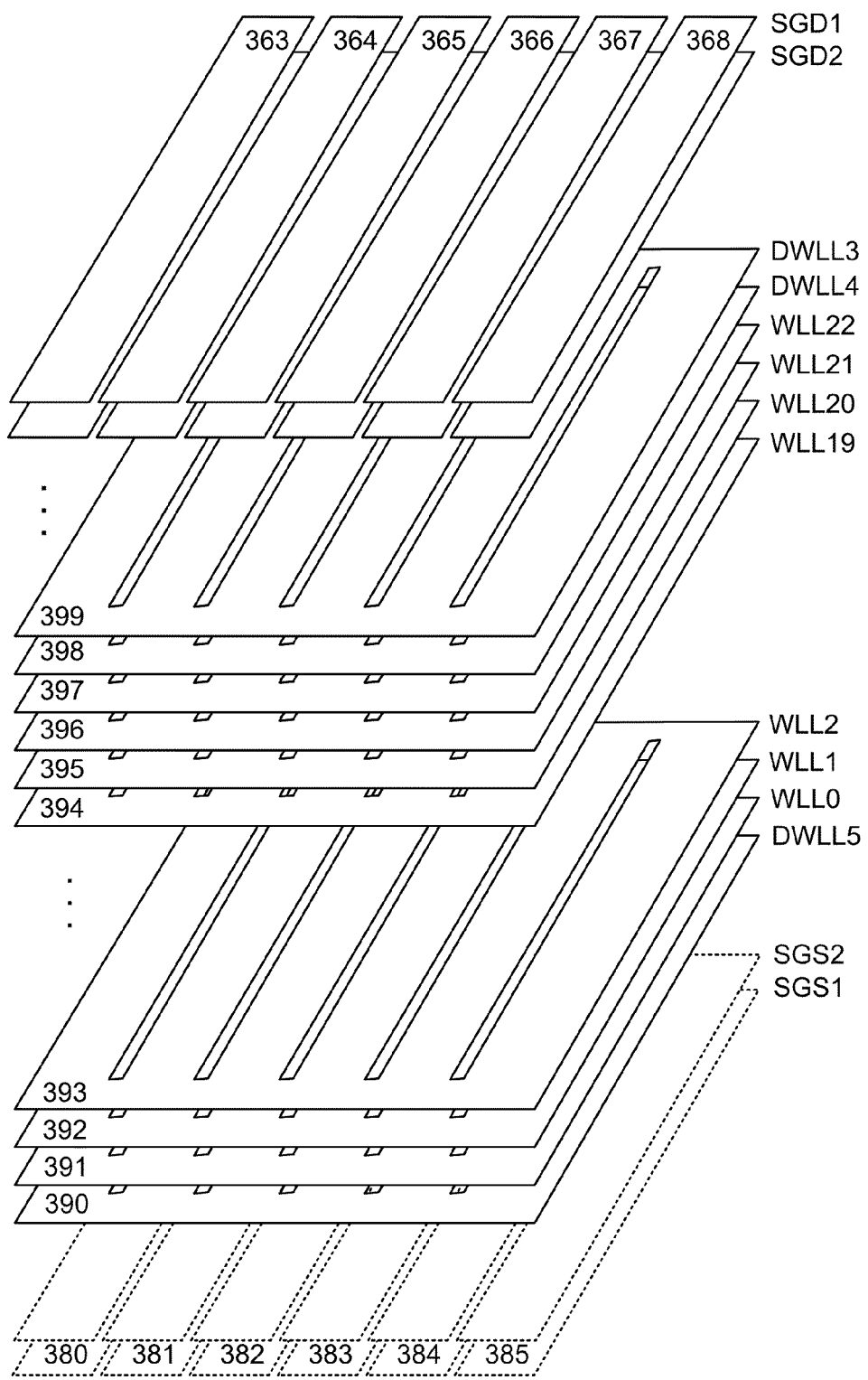
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL3, DWLL4, WLL22, WLL21, WLL20 and WLL19 represent word lines 399, 398, 397, 396, 395 and 394, respectively. WLL2, WLL1, WLL0 and DWLL5 represent word lines 393, 392, 391 and 390, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

In an example programming operation, the source-side word line 391 is a first programmed word line and a drain-side word line 397 is a final programmed word line in a block.

FIG. 4A depicts a view of the region 246 of FIG. 3C1, showing SGD transistors D1a, D1a1 and D1a2 above a dummy memory cell (DMC) and a data-storing memory cell (MC). A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunneling layer (TL) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a, D1a1 and D1a2, the dummy memory cell DMC and the memory cell MC, respectively. In another approach, all of these layers except the metal are provided in the column. Additional memory cells are similarly formed throughout the columns. The layers in the memory hole form a columnar active area (AA) of the NAND string.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string. In particular, to provide the select gate transistors in a non-conductive state, a relatively low voltage is applied to their control gates, resulting in a relatively lower amount of channel boosting in a region of the channel next to these select gate transistors. A region of the channel next to an edge cell will therefore also have a relatively lower amount of channel boosting. In contrast, the cells next to a non-edge cell can receive a relatively high pass voltage since these cells are provided in a conductive state, resulting in a relatively higher amount of channel boosting.

When a memory cell is programmed, electrons are stored in a portion of the CTL which is associated with the memory cell. These electrons are drawn into the CTL from the channel, and through the TL. The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B1 depicts a cross-section view of the region 246 of FIG. 4A along line 444. Each layer is ring-shaped in one possible approach, except the core filler, which is a cylinder.

FIG. 4B2 depicts a close-up view of the tunneling layer 404 of FIG. 4B1, showing an oxide 404a, nitride 404b, oxide 404c configuration.

FIG. 4C depicts an expanded view of a portion of the SGD transistor D1a of FIG. 4A. In one approach, an erase operation can involve charging up a channel of the NAND string while floating the voltages of the control gates of the memory cells. This allows the voltages of the control gates of the memory cells to increase with the voltage of the channel due to coupling. The voltages of the control gates of the memory cells are then driven lower, such as to ground or a negative voltage, generating an electric field which drives electrons out of a charge-trapping layer and into the channel, lowering the threshold voltages of the memory cells. This process can be repeated in multiple erase-verify iterations until the threshold voltages of the memory cells are below a desired erase verify level, e.g., Vv_erase.

The charging up of the channel occurs due to GIDL of the select gate transistors at the drain and/or source ends of the NAND string. The select gate transistors are reversed biased, e.g., with a positive drain-to-gate voltage, which results in the generation of electron-hole pairs. For example, at the drain end of a NAND string, a bit line voltage (erase pulse) is applied which exceeds a voltage at the control gate of a drain-side select gate transistor by a few Volts. Similarly, at the source end of a NAND string, a source line voltage is applied which exceeds a voltage at the control gate of a source-side select gate transistor. The electrons are swept away by the electrical field and collected at the bit line and/or source line terminals; while holes will drift to the channel and help to charge up the channel. That is, the electrons will drift toward the high voltage of the bit line or source line, while the holes will drift toward a low voltage.

GIDL results in the generation of electron-hole pairs, including example electrons 450 and holes 451. As indicated by the arrows, the electrons are attracted to the high erase voltage at the drain or source end of the NAND string while the holes are attracted to a lower voltage region of the channel. When multiple select gate transistors are used at one end of a NAND string, each select gate transistor can generate a similar amount of GIDL. Additionally, one or more dummy memory cells can receive a bias which is similar to the bias of the select gate transistor and generate GIDL. A one-sided or two-sided erase may be used. In a one sided erase, one or more select gate transistors at the drain end of the NAND string, and optionally, one or more dummy memory cells at the drain end, are biased to generate GIDL. A two-sided erase augments the GIDL generated at the drain end by also biasing one or more select gate transistors at the source end of the NAND string, and optionally, one or more dummy memory cells at the source end, to generate GIDL. The SGD transistor D1a has a source side SR1a and a drain side DR1a.

The dummy memory cells and the select gate transistors have a threshold voltage which is kept within a fixed range.

FIG. 4D depicts an expanded view of a region 410 of the NAND string of FIG. 3C2. When a program voltage is applied to the control gate of a memory cell via a respective word line, an electric field is generated. In MC0, the electric field causes electrons to tunnel into a region 470 of the charge-trapping layer 403, from the channel 405. Similarly, for MC1, the electric field causes electrons to tunnel into a region 460 of the charge-trapping layer 403, from the channel 405. The movement of the electrons into the charge-trapping layer is represented by the arrows which point to the left. The electrons are represented by circles with a dash inside the circle.

When a memory cell on a selected word line is subsequently read back, control gate read voltages such as VreadA, VreadB and VreadC are applied to the memory cell while sensing circuitry determines whether the memory cell is in a conductive state. At the same time, a read pass voltage, Vread (e.g., 8-9 V), is applied to the remaining word lines.

However, as mentioned at the outset, the accuracy of the read back operation can be impaired by charge loss in the memory cells. One type of charge loss involves de-trapping from the charge-trapping layer. For example, an electron 452 is an example of a charge which has de-trapped from the charge-trapping region 470, lowering the Vth of MC0. An electron 453 is an example of a charge which remains in the charge-trapping region 470. Another type of charge loss, described also in connection with FIG. 6C, involves de-trapping from the tunneling layer. For example, an electron 452a is an example of a charge which has de-trapped from the tunneling layer 404.

MC1 has a drain DR1b, a source SR1b and a control gate CG1.

Figure 5A:
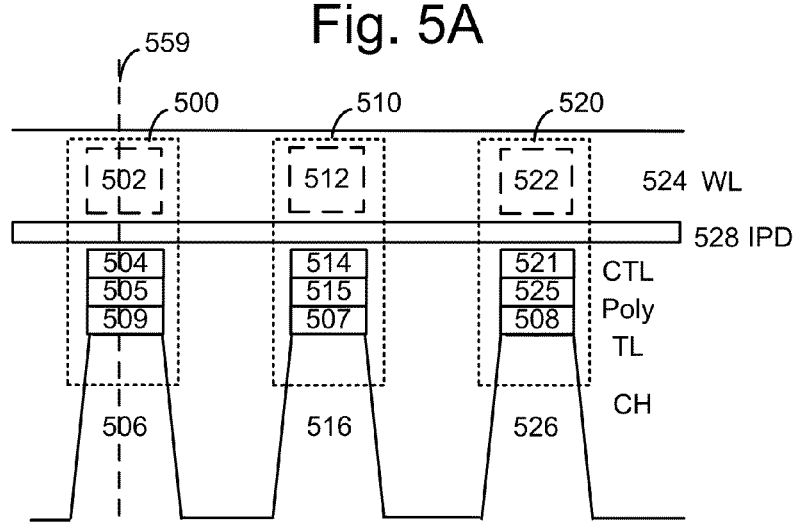
FIG. 5A depicts a cross-sectional view in a word line direction of memory cells comprising a flat control gate and charge-trapping regions as a 2D example of memory cells in the memory structure 126 of FIG. 1B.

FIG. 5A depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel ling layer (TL) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

Figure 5B:
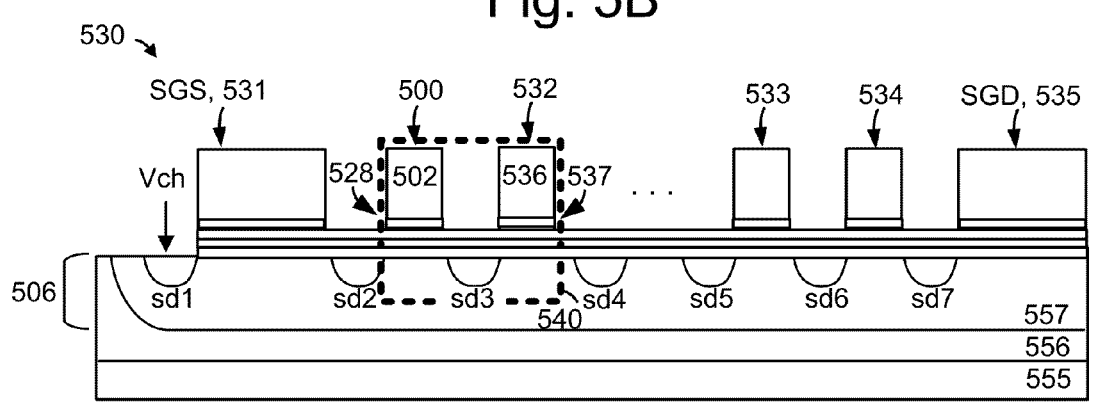
FIG. 5B depicts a cross sectional view along line 559 in FIG. 5A, showing a NAND string 530 having a flat control gate and a charge-trapping layer.

FIG. 5B depicts a cross sectional view along line 559 in FIG. 5A, showing a NAND string 530 having a flat control gate and a charge-trapping layer. The NAND string 530 includes an SGS transistor 531, example storage elements 500, 532, ..., 533 and 534, and an SGD transistor 535. In one option, the SGD transistor can be biased to produce GIDL during an erase operation, as discussed primarily in connection with the 3D memory device. In another option, the substrate can be biased directly to provide a channel voltage, while the word lines are biased at a negative voltage.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well 557. A channel voltage, Vch, may be applied directly to the channel region of the substrate. The memory cell 500 includes the control gate 502 and an IPD portion 528 above the charge-trapping layer 504, the polysilicon layer 505, the tunneling layer 509 and the channel region 506. The memory cell 532 includes a control gate 536 and an IPD portion 537 above the charge-trapping layer 504, the polysilicon layer 505, the tunneling layer 509 and the channel region 506.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance. A difference between a floating gate memory cell and the flat memory cell is the height of the charge storage layer. A typically floating gate height may be about 100 nm, while a charge-trapping layer can be as small as 3 nm, and the polysilicon layer can be about 5 nm.

The SGD and SGS transistors have the same configuration as the storage elements but with a longer channel length to ensure that current is cutoff in an inhibited NAND string.

In this example, the layers 504, 505 and 509 extend continuously in the NAND string. In another approach, portions of the layers 504, 505 and 509 which are between the control gates 502, 512 and 522 can be removed, exposing a top surface of the channel 506.

Figure 5C:
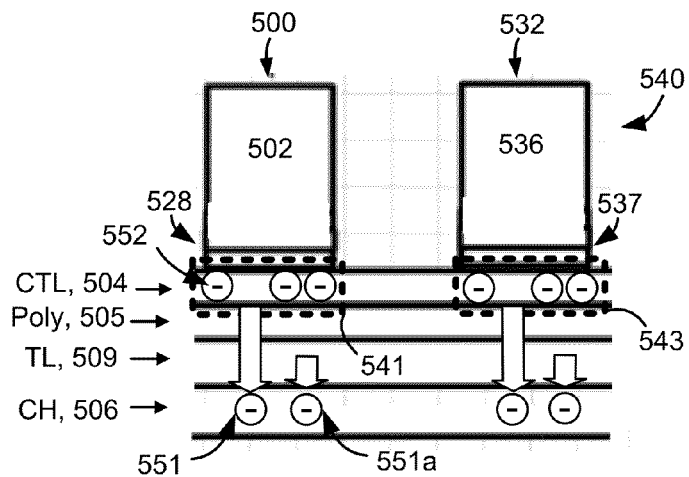
FIG. 5C depicts an expanded view of a portion 540 of the NAND string of FIG. 5B.

FIG. 5C depicts an expanded view of a portion 540 of the NAND string of FIG. 5B. The charge-trapping layer 504 includes regions 541 and 543 which are directly under and adjacent to the memory cells 500 and 532, respectively. Charge loss can occur in a 2D memory device in a similar way as in the 3D memory device. One type of charge loss involves de-trapping from the charge-trapping layer. For example, an electron 551 is an example of a charge which has de-trapped from the charge-trapping region 541, lowering the Vth of the memory cell 500. An electron 552 is an example of a charge which remains in the charge-trapping region 541. Another type of charge loss, discussed also in connection with FIG. 6C, involves de-trapping from the tunneling layer. For example, an electron 551a is an example of a charge which has de-trapped from the tunneling layer 509.

Figure 5D:
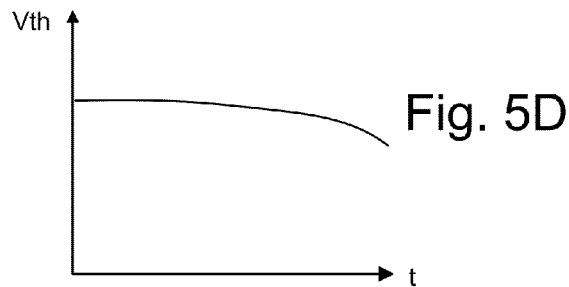
FIG. 5D is a plot of Vth versus time, showing a decrease in Vth after a memory cell is programmed due to charge loss.

FIG. 5D is a plot of Vth versus time, showing a decrease in Vth after a memory cell is programmed due to short-term charge loss. The horizontal axis depicts time on a logarithmic scale and the vertical axis depicts the Vth of a memory cell. After the memory cell is programmed to an initial Vth of its target data state, its Vth gradually decreases. In some case, the rate of decrease is a function of the data state.

Figure 6A:
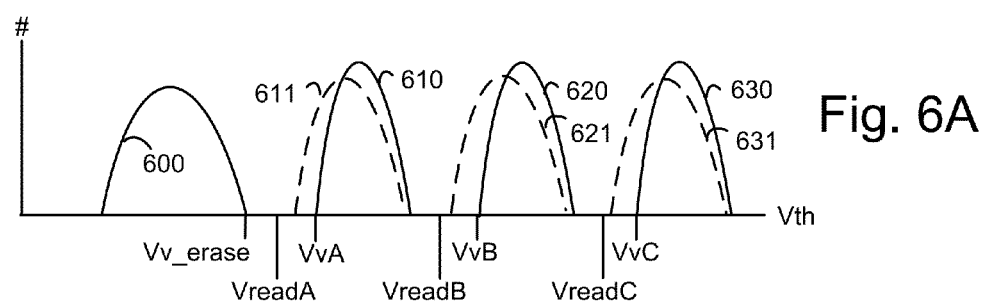
FIG. 6A depicts Vth distributions of a set of memory cells, showing a decrease in Vth due to charge loss without a data retention operation.
Figure 6B:
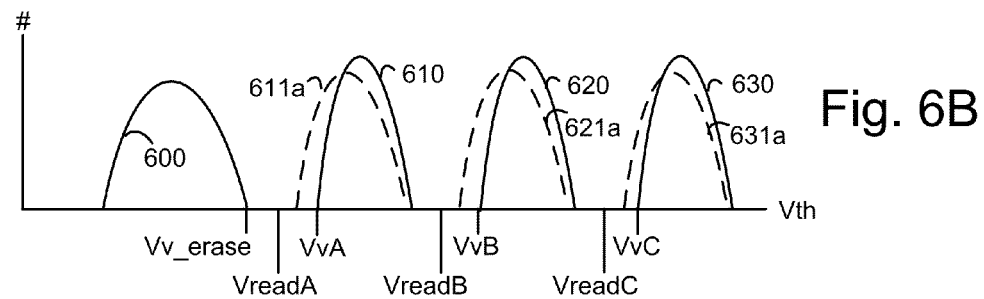
FIG. 6B depicts Vth distributions of a set of memory cells, showing a smaller decrease in Vth due to charge loss compared to FIG. 6A, consistent with the data retention operation of step 705 of FIG. 7A.

FIG. 6A depicts Vth distributions of a set of memory cells, showing a decrease in Vth due to charge loss without a data retention operation. In FIGS. 6A and 6B, the horizontal axis depicts Vth and the vertical axis depicts a number of memory cell, on a logarithmic scale. A set of memory cells may be initially erased to an erased state Vth distribution 600 using a verify voltage of Vv_erase. Subsequently, when a command to program data is issued, the set of memory cells is programmed from the erased state to the target data states of A, B and C using verify voltages of VvA, VvB and VvC, respectively, in a four state memory device. In other cases, eight, sixteen or more data states are used. The erased state and the A, B and C states are represented by Vth distributions 600, 610, 620 and 630, respectively. After programming, charge loss occurs over time due to the redistribution of holes in the charge-trapping material of the memory cells, so that the Vth distributions 610, 620 and 630 shift down and widen to become the Vth distributions 611, 621 and 631, respectively.

Figure 7A:
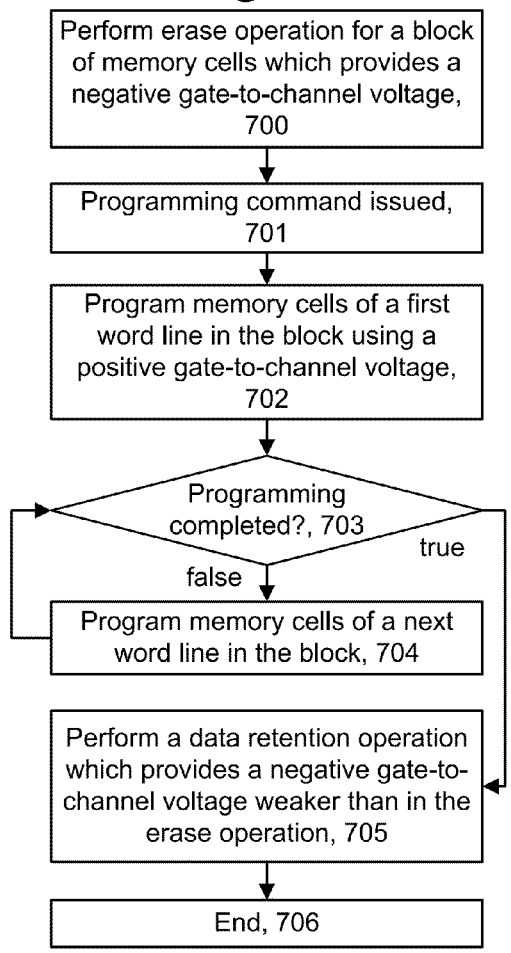
FIG. 7A depicts an example process which involves an erase operation, a programming operation and a data retention operation.

FIG. 6B depicts Vth distributions of a set of memory cells, showing a smaller decrease in Vth due to charge loss compared to FIG. 6A, consistent with the data retention operation of step 705 of FIG. 7A. In this case, the Vth distributions 610, 620 and 630 shift down and widen to become the Vth distributions 611a, 621a and 631a, respectively. In some cases, the narrowing of the Vth width compared to FIG. 6A is largest for the highest data state, e.g., the C state.

Figure 6C:
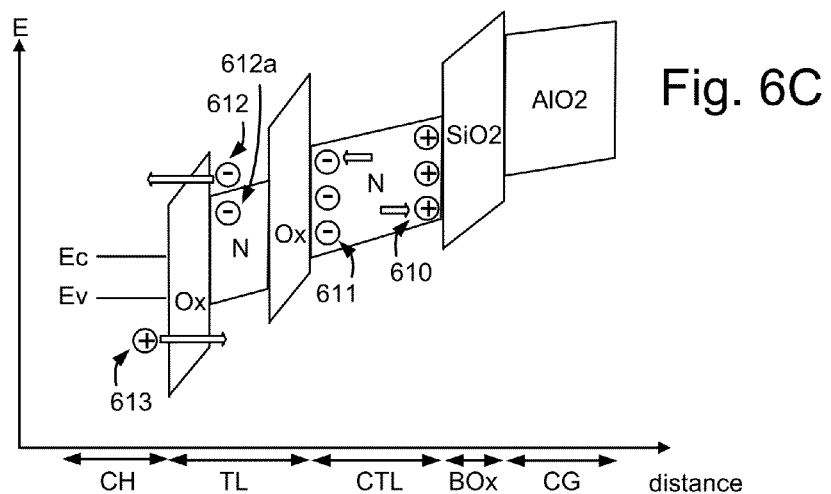
FIG. 6C depicts an energy band diagram for a charge-trapping memory cell.

FIG. 6C depicts an energy band diagram for a memory cell. The horizontal axis depicts a distance in the memory cell. For example, this can be a lateral distance in a 3D memory device or a vertical distance in a 2D memory device. The vertical axis depicts an energy level. The memory cell includes a channel layer (CH), a tunneling layer (TL) comprising a nitride (N) region between oxide (Ox) regions, a charge-trapping layer (CTL), a block oxide (BOx) and a control gate (CG). Ec denotes the conduction band energy and Ev denotes the valence band energy in the channel region.

In this example, the tunneling layer comprises a charge-trapping material such as nitride, similar to the charge-trapping material in the charge-trapping layer. However, the thickness of the charge-trapping material in the tunneling layer is a fraction, e.g., 10-30%, of the thickness in the charge-trapping layer so the amount of charge stored is much smaller. Such a tunneling layer is referred to as an engineered tunneling barrier and can provide a faster program and erase speed as well as a larger memory window and improved retention and endurance characteristics.

In such a memory device, some electrons, e.g., electron 612a, can be trapped in the tunneling layer rather than reaching the charge-trapping layer during programming. A first mechanism of the data retention operation described herein can de-trap electrons, e.g., electron 612, from the ONO tunneling layer to the channel, resulting in a decrease in the Vth. This is represented by an electron 612. This de-trapping occurs because the data retention operation provides a negative gate-to-channel voltage which tends to attract electrons to the channel. A second mechanism involves injecting a small amount of holes, e.g., hole 613, from the channel into the ONO tunneling layer. This occurs because the negative gate-to-channel voltage tends to attract holes from the channel. The holes can recombine with previously trapped electrons, e.g., electron 612a, creating neutral electron-hole dipoles. The presence of a neutral electron-hole dipole in place of an electron decrease the Vth.

A third mechanism involve redistributing the electrons 611 and the holes 610 inside the charge-trapping layer, resulting in an increase in Vth which roughly cancels out the increase in Vth due to the first and second mechanisms when the data retention operation is optimized. The negative gate-to-channel voltage tends to move the electrons 611 in the charge-trapping layer closer to the channel and to move the holes 610 in the charge-trapping layer further from the channel. These movements increase the Vth of the memory cell. The third mechanism takes advantage of the fact that the trapped charges have different energy levels and locations in the charge-trapping layer.

Thus, even if the Vth of a memory cell does not change, the number of trapped electrons in the ONO tunneling layer is reduced so that downshifts in Vth over time due to de-trapping of electrons from the ONO tunneling layer to the channel also are reduced. Data retention of the memory cells is therefore improved.

FIG. 7A depicts an example process which involves an erase operation, a programming operation and a data retention operation. Step 700 involves performing an erase operation for a block of memory cells, e.g., in response to an erase command. The erase operation provides a negative gate-to-channel voltage for the memory cells. See FIG. 7C. In one approach, the erase operation is performed for all memory cells in a block concurrently. Typically, an erase command is issued in response to a user request at a host device or in response to an internal command from the memory device. In some cases, data may be moved from a first block to a second block after which the data is erased from the first block. An erased block is available to store data in a subsequent programming command.

At step 701, a program command is issued, such as from the controller. Step 702 involves programming memory cells of a first word line in the block using a positive gate-to-channel voltage. See FIG. 7D. Generally, the programming may proceed in a word line programming order, starting from a source-side word line of the block and proceeding one word line at a time to a drain-side word line of the block until all data has been programmed. In some cases, only part of the block is programmed so that the memory cells of some word line are unprogrammed. A decision step 703 determines if programming is completed. This decision step is true if all of the data associated with the program command has been programmed. If decision step 703 is true, step 705 is reached.

Step 705 involves performing a data retention operation, e.g., an operation which improves data retention of the set of memory cells. The data retention operation provides a negative gate-to-channel voltage for the memory cells which is weaker than the negative gate-to-channel voltage of the erase operation. In the case of an incremental step pulse erase operation, the data retention operation can provide a negative gate-to-channel voltage for the memory cells which is weaker than a final negative gate-to-channel voltage of the erase operation. See, e.g., FIG. 10C.

In one approach, the data retention operation is performed for all of the programmed word lines concurrently, where the programmed word lines make up an entire block or only a proper subset of a set of word lines in the block. In this case, the additional time used for the data retention operation is a small fraction of the overall programming time. If decision step 703 is false, step 704 programs memory cells of a next word line in the block. Step 706 ends the process.

Figure 7C:
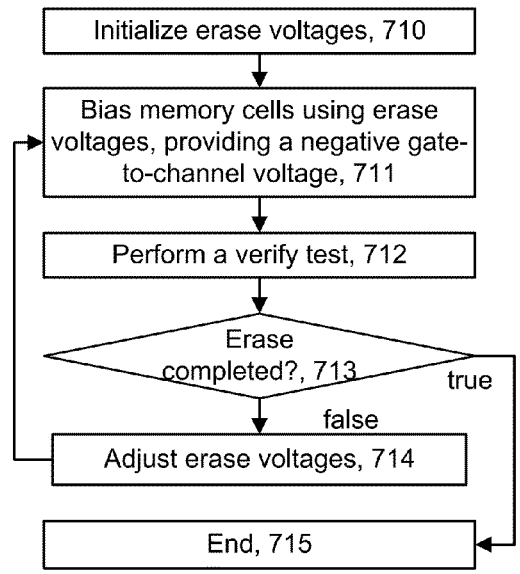
FIG. 7C depicts an example erase operation consistent with step 700 of FIG. 7A.
Figure 7D:
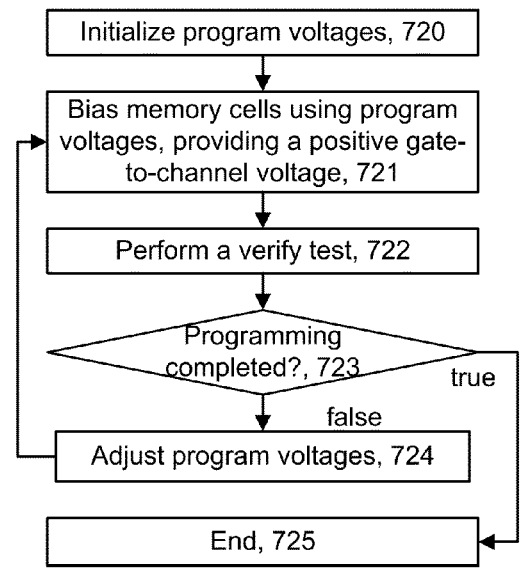
FIG. 7D depicts an example programming operation for a word line consistent with step 702 and 704 of FIG. 7A.
Figure 7B:
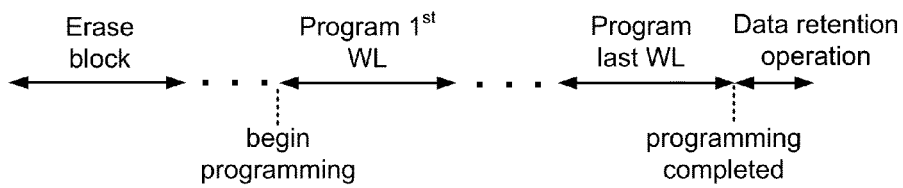
FIG. 7B depicts an example timeline consistent with the process of FIG. 7A.

FIG. 7B depicts an example timeline consistent with the process of FIG. 7A. The timeline includes erasing a block followed sometime later by beginning a programming operation. At this time, a first word line is programmed followed by other word lines up to a last word line in the block, for instance, at which time the programming operation is completed. The programming is followed by a data retention operation, e.g., immediately after the programming operation or some time later. Generally, the data retention operation occurs in connection with, and in response to completion of, the programming operation.

FIG. 7C depicts an example erase operation consistent with step 700 of FIG. 7A. Step 710 initializes erase voltages. For example, this can include voltages for the control gates of memory cells and select gate transistors, bit lines, source lines and channels. For an incremental step pulse erase operation, an initial erase voltage which is applied to the word line, drain or source can be initialized. Step 711 includes biasing the memory cells using the erase voltages, providing a negative gate-to-channel voltage. Step 712 includes performing a verify test for the set of memory cells. See, e.g., FIG. 8C. Decision step 713 determines if the erase operation is completed, e.g., based on results of the verity test. If decision step 713 is true, the end of the erase operation is reached at step 715. If decision step 713 is false, the erase voltage are adjusted at step 714 and the memory cells are again biased using the erase voltages at step 711, in a next iteration of the erase operation.

FIG. 7D depicts an example programming operation for a word line consistent with step 702 and 704 of FIG. 7A. Step 720 initializes program voltages for the currently selected word line. For example, this can include voltages for the control gates of memory cells and select gate transistors, bit lines, source lines and channels. For an incremental step pulse programming operation, an initial program voltage which is applied to the word line, drain or source can be initialized. Step 711 includes biasing the memory cells using the program voltages, providing a positive gate-to-channel voltage. Step 722 includes performing a verify test for the memory cells connected to the word line. For example, this can involve applying verify voltages (e.g., VvA, VvB or VvC; see FIG. 6A) to the word line. Decision step 723 determines if programming of the memory cells is completed. This is true when all, or almost all, of the memory cells have passed their respective verify test. If decision step 723 is false, the program voltages such as Vpgm are adjusted at step 724 and step 721 is repeated in a next program-verify iteration. If decision step 723 is true, the programming ends at step 725.

FIG. 8A depicts a circuit diagram of a NAND string consistent with the memory devices of FIGS. 2C and 3C1. An example NAND string NS0A, consistent with FIG. 3C1 (or NS0 consistent with FIG. 2C), includes SGD transistors 801, 802 and 803, a drain-side dummy memory cell 804, data-storing memory cells 805, . . . , 806, a source-side dummy memory cell 807, and SGS transistors 808, 809 and 810. A bit line 812 connects the drain end of the NAND string to sensing circuitry 800, which is used to sense the NAND string during operations involving the select gate transistors and the memory cells. A source line 811 is connected to a source end of the NAND string. Voltage drivers can be used to provide the voltages depicted. For example, Vsg is applied to the control gates of the SGD transistors, which are optionally connected to one another and to the control gates of the SGS transistors, which are optionally connected to one another. Vsg can also be applied to the dummy memory cells 804 and 807. During an erase operation, a common control gate voltage Vcg can be applied to each of the data-storing memory cells concurrently, in this example. During a programming operation, a program voltage Vpgm is applied to the selected word line and pass voltages are applied to the other word lines. Vbl is the bit line voltage and Vsl is the source line voltage. I_NAND is a sensed current in the NAND string. The current can be sensed during a verify test of an erase operation or a programming operation, as well as during a read operation in which the data states of the memory cells are determined.

FIG. 8B1 depicts a circuit diagram of the memory cell 806 of FIG. 8A. The memory cell includes a number of terminals including a drain (D) terminal which may have a voltage Vbl, a source (S) terminal which may have a voltage Vsl, a control gate (CG) terminal which may have a voltage Vcg and a channel (CH) terminal which may have a voltage Vch.

FIG. 8B2 depicts a circuit diagram of the SGD transistor 801 of FIG. 8A. The transistor includes a number of terminals including a drain (Dsg) terminal which may have a voltage Vbl, a source (Ssg) terminal which may have a voltage Vsl, a control gate (CGsg) terminal which may have a voltage Vcg and a channel (CHsg) terminal which may have a voltage Vch.

FIG. 8C depicts a plot of Vth versus I_NAND, a current in a NAND string during a sensing operation, consistent with step 712 of FIG. 7C or step 722 of FIG. 7D. An erase operation can include a number of erase-verify iterations which are performed until the erase operation is completed. An erase-verify iteration includes an erase portion in which an erase voltage is applied, followed by a verify test. While it possible to verify memory cells in one or more selected word lines, typically an entire block is erased, in which case the verification can be performed concurrently for all memory cells in one or more NAND strings. During a verify operation for the memory cells of a NAND string, a verify voltage (Vv_erase) is applied to the control gates of the memory cells while a bit line voltage is supplied using sensing circuitry. The select gate transistors and dummy memory cells are provided in a conductive state and act as pass gates. A current in the NAND string is detected and compared to a reference current, e.g., using a current comparison circuit. If the current in the NAND string exceeds the reference current, this indicates the cells in the NAND string are in a conductive state, so that their Vth is below Vv_erase. That is, all of the cells in the NAND string are erased and the NAND string passes the verify test. On the other hand, if the current in the NAND string does not exceed the reference current, this indicates the cells in the NAND string are in a non-conductive state, so that their Vth is above Vv_erase. That is, not all of the cells in the NAND string are erased and the NAND string does not pass the verify test.

In one approach, the memory device has the capability to apply Vv_erase as a negative voltage on the word lines, such as by using a negative charge pump. In this case, the drain (bit line) and source can be set at 0 V, and there is a positive source-to-control gate voltage of the memory cells. For example, with Vv_erase=−2 V and Vsource=0 V, Vsource−Vv_erase=0−(−2)=2 V. In other cases, it may be desired to apply a zero or positive control gate voltage during sensing. To do this, Vsource can be elevated so that there is still a positive source-to-control gate voltage. For example, with Vv_erase=0 V and Vsource=2 V, Vsource-Vv_erase=2−(0)= 2 V, as before. The same Vth in a memory cell can therefore be sensed without using a negative control gate voltage.

For a set of NAND strings, the erase operation can be considered to be completed when all, or at least a specified majority, of the NAND strings pass the verify test. If the erase operation is not completed after an erase-verify iteration, another erase-verify iteration can be performed using a stronger erase voltage.

FIG. 9A1 depicts a table of example voltages used in a one-sided erase operation for a 3D memory device. A one-sided erase operation charges the channel of a NAND string from the drain side, using GIDL which is generated from the SGD transistor. In contrast, a two-sided erase operation also charges the channel of a NAND string from the source side, using GIDL which is generated from the SGS transistor. In one approach, Vcg, the word line voltage, is maintained at 0 V while the channel is charged while floating. The SGD transistor has its drain biased at a relatively high positive level such as Verase1=12-20 V via the bit line (Vbl). The control gate of the SGD transistor is biased at a lower, positive voltage (Vsgd=Vsg_er), and GIDL is generated in proportion to the amount by which Vbl exceeds Vsgd (Verase1−Vsg_er). In an incremental step pulse erase process, multiple erase loops are performed until a verify test is passed. Vbl may be stepped up in each loop to charge the channel to increasingly higher levels. The high potential in the channel exceeds Vcg by a substantial amount such that a substantial negative gate-to-channel voltage is provided across the memory cells. As a result, electrons are attracted to the channel from the charge-trapping layer. See also FIG. 10A. The verify test may apply Vv_erase to each of the word lines in a block concurrently while sensing the current in the NAND strings. In one option, Vcg is allowed to float while the channel is charged and is then driven at 0 V. See FIG. 12. In another option, Vcg is fixed at 0 V while the channel is being boosted. The SGS can be in a non-conductive state by applying a larger voltage to the source of the SGS transistor than to the control gate. For example, Vsgs=0 V and Vsl=2 V.

FIG. 9A2 depicts a table of example voltages used in a one-sided data retention operation for a 3D memory device. Generally, the data retention operation can be considered to be a weak erase operation, so that a one-sided or two-sided data retention operation is possible. A one sided data retention operation can proceed in the same way as a one sided erase operation expect the channel is charged up to a lesser degree. For example, the bit line voltage Vbl=Ver_dr1, can be lower than for the erase operation of FIG. 9A1 (Ver_dr1<Verase1). The SGD control gate voltage, Vsg_dr, can also be lower than in FIG. 9A1 (Vsg_dr<Vsg_er), so that a lesser amount of GIDL is generated in the channel.

FIG. 9B1 depicts a table of example voltages used in a two-sided erase operation for a 3D memory device. This approach is similar to FIG. 9A1 except Vsgs is biased similarly to Vsgd and Vsl is biased similarly to Vbl to generate GIDL from the SGS transistor.

FIG. 9B2 depicts a table of example voltages used in a two-sided data retention operation for a 3D memory device. This approach is similar to FIG. 9A2 except Vsgs is biased similarly to Vsgd and Vsl is biased similarly to Vbl to generate GIDL from the SGS transistor. Another option is to use a one-sided erase operation and a two-sided data retention operation, or a one-sided erase operation and a two-sided data retention operation.

In the examples of FIG. 9A1-9B2, the memory cells can be in NAND strings, the NAND strings comprise drain-side select gate transistors, and the memory cells are configured to provide the negative gate-to-channel voltage comprises applying a voltage (Verase1) to drains of the drain-side select gate transistors and a voltage (Vsg_er) to control gates of the drain-side select gate transistors which cause the drain-side select gate transistors to charge up the channels by gate-induced drain leakage. The channels of the memory cells extend in vertical pillars in this example.

FIGS. 9A1 and 9A2 provide voltages which can be used in performing an erase operation for a set of memory cells by applying a voltage (Verase1) to the drains of the drain-side select gate transistors and a voltage (Vsg_er) to the control gates of the drain-side select gate transistors which cause the drain-side select gate transistors to charge up the channels by gate-induced drain leakage, wherein the voltage applied to the drains of the drain-side select gate transistors in the data retention operation is lower than the voltage applied to the drains of the drain-side select gate transistors in the erase operation.

Also, the voltage (Ver_dr1) applied to the drains of the drain-side select gate transistors in the data retention operation can be 30-70% of the voltage (Verase1) applied to the drains of the drain-side select gate transistors in the erase operation.

Further, the voltage (Verase1) applied to the drains of the drain-side select gate transistors in the erase operation is stepped up in magnitude using incremental step pulse erasing, starting from an initial voltage (Verase1$a$) and ending at a final voltage (Verase1$d$), and the voltage (Ver_dr1) applied to the drains of the drain-side select gate transistors in the data retention operation is 30-70% of the final voltage.

FIG. 9C1 depicts a table of example voltages used in an erase operation for a 2D memory device. Another approach to an erase operation involves a negative Vcg. In this case, the channel may be grounded while Vcg is applied (e.g., Vcg=Verase2=-5 to -10 V), creating a negative gate-to-channel voltage. See, e.g., FIG. 11A. Additionally, the memory cells have a positive drain-to-source bias of a few Volts, such as by applying Vbl=5 V while Vsgd is slightly higher, e.g., 7 V, to be in a conductive state to pass Vbl, and Vsl is grounded while Vsgs is slightly higher, e.g., 2 V to be in a conductive state to pass Vsl. The positive drain-to-source voltage can create a current which assist in the erase process. The channel can be grounded (Vch=0 V) in one approach by grounding the p-well of the substrate.

In the examples of FIGS. 9C1 and 9C2, the memory cells can be in NAND strings, and the channels of the memory cells can extend in a substrate. The memory cells can be configured to provide negative gate-to-channel voltage by applying a voltage (Verase2=-5 to -10 V) to the control gates of the memory cells and applying a voltage (Vch=0 V) to the substrate, where the voltage applied to the substrate exceeds the voltage applied to the control gates, e.g., 0 V exceeds -5 to -10 V.

The voltages of FIGS. 9C1 and 9C2 can be used for performing an erase operation for a set of memory cells by applying a voltage (Verase2) to the control gates of the memory cells and applying a voltage (Vch) to the substrate, wherein a magnitude (e.g., 5 V) of the voltage applied to the control gates in the data retention operation is lower than a magnitude (e.g., 10 V) of the voltage applied to the control gates in the erase operation.

Further, the magnitude of the voltage applied to the control gates in the data retention operation can be 30-70% of the magnitude of the voltage applied to the control gates in the erase operation.

FIG. 9C2 depicts a table of example voltages used in a data retention operation for a 2D memory device. This process is similar to FIG. 9C1 except the magnitude of the negative gate-to-channel voltage can be made smaller by reducing the magnitude of Vcg, for instance. For example, with Vch=0 V, Vcg=Ver_dr2=-5 V is the highest magnitude erase voltage in the data retention operation and Vcg=Verase2=-10 V is the highest magnitude erase voltage in the erase operation.

FIG. 9D depicts a table of example voltages used in a programming operation for a 3D memory device. During programming, a positive control gate voltage (Vpgm) is applied to a memory cell. The drain of each memory cell is grounded by setting Vbl=0 V and Vsgd=2 V to make the SGD transistor conductive to pass Vbl to the channel. The SGS transistor is made non-conductive by setting Vsl>Vsgs, e.g., Vsl=2 V and Vsgs=0 V.

FIG. 9E depicts a table of example voltages used in a programming operation for a 2D memory device. A positive control gate voltage (Vpgm) is applied to a memory cell. A positive drain-to-source voltage is applied by setting Vbl=5 V and Vsl=0 V, for instance. Vsgd=7 V to make the SGD transistor conductive and Vsgs=2 V to make the SGS transistor conductive. The channel is floated. This approach causes channel hot electrons to be transported from the channel in p-well into the charge-trapping layer in a region near the drain of the memory cell.

FIG. 10A depicts a waveform in an example erase operation which uses gate-induced drain leakage (GIDL) to charge up a channel, consistent with step 700 of FIG. 7A. The vertical axis depicts voltage and the horizontal axis depicts time. The waveform 1000 depicts a series of bit line and/or source line voltages 1010, 1020, 1030 and 1040 with magnitudes of Verase1$a$, Verase1$b$, Verase1$c$ and Verase1$d$, respectively, which step up by dVer1 in each erase-verify iteration. The waveform also depicts select gate voltages 1011, 1021, 1031 and 1041 with a common magnitude of Vsg_er, in one approach. In another approach, the select gate voltage also steps up with the bit line and/or source line voltage. The waveform provides a number of erase-verify iterations EV1, EV2, EV3 and EV4, each of which is followed by a verify test Vver1, Vver2, Vver3 or Vver4, respectively. As mentioned, the channel of a NAND string can be charged up in an erase operation based on GIDL which is generated in proportion to the drain-to-gate voltage of one or both selected gate transistors.

In another option, the erase voltage steps up to its peak in two steps instead of one to allow time for the charge up of the channel to occur. In another option, the erase voltage and the select gate voltage both step up to their peaks in two steps.

FIG. 10B depicts a waveform in an example data retention operation which uses GIDL to charge up a channel, consistent with step 705 of FIGS. 7A and 9A1 to 9B2. The vertical axis depicts voltage and the horizontal axis depicts time. A waveform 1050 depicts a bit line and/or source line voltage of Ver_dr1 and the waveform 1051 depicts a SGD and/or SGS transistor control gate voltage of Vsg_dr. The magnitude of the erase voltages for the data retention operation can be optimized to provide an optimum reduction in the Vth width, as discussed in connection with FIG. 10C.

FIG. 10C is a plot of a Vth width of a highest target data state on the vertical axis versus an erase voltage (Ver_dr) in a data retention operation on the horizontal axis, showing an optimum value (Ver_dr_op) of Ver_dr in FIG. 10B. For example, this can be the width of the Vth distribution 631 of FIG. 6A. In the approach of FIGS. 10A and 10B, the magnitude of the bit line and/or source line voltage for the data retention operation can be set as a predetermined portion of the magnitude of the highest bit line and/or source line voltage for the erase operation. The predetermined portion can be optimized from testing of the memory device to minimize the Vth width. The plot was obtained by performing a programming operation followed by a data retention operation in which the bit line and/or source line voltage for the data retention operation is a predetermined percentage of the highest bit line and/or source line voltage for the erase operation, for different values of the percentage. The Vth width was then measured, and the results plotted. Generally, if the data retention operation is too weak (e.g., Ver_dr is too low), there will be no changed in the Vth width. But, if the data retention operation is too strong (e.g., Ver_dr is too high), there will be an undesirable increase in the Vth width.

Vsg_dr is a voltage applied to the control gates of the SGD and/or SGS select gates. In one approach in which the erase operation generates GIDL in the channel of a NAND string, the amount of GIDL is proportional to the amount by which Ver_dr exceeds Vsg_dr. Accordingly, Ver_dr_op can vary based on Vsg_dr. Generally, Ver_dr_op is higher when Vsg_dr is higher. In an erase operation which does not use GIDL, and a negative Vcg is used, Ver_dr_op can vary is proportion to the magnitude of Vcg, for instance.

Typically, in the case of an erase operation which uses GIDL (e.g., FIG. 9A1-9B2), Ver_dr1_op may be less than 30-70% of Vbl or Vsl, from 30-70% of Vbl or Vsl, or from 40-60% of Vbl or Vsl. In the case of an erase operation which uses a negative control gate voltage (e.g., FIGS. 9C1 and 9C2), Ver_dr2_op is less than 30-70% of Verase2, from 30-70% of Verase2, or from 40-60% of Verase2. Or, the largest erase voltage used in the data retention operation can be up to 30-70% or 40-60% of the largest erase voltage used in the regular erase operation. A stronger erase operation is generally needed when the tunneling layer is thicker.

FIG. 10D is a plot of an optimum value (Ver_dr_op) in a data retention operation as a function of a number of program-erase (PE) cycles in a block of a memory device. In one approach, a magnitude of the optimum negative gate-to-channel voltage is relatively smaller when a number of program-erase cycles in the memory device is relatively larger. This means a magnitude of the optimum erase voltage (e.g., Vbl, Vsl or Vcg) is relatively smaller when the number of program-erase cycles in the memory device is relatively larger. This is true because memory cells tend to erase more quickly as PE cycles are accumulated. Reducing the strength of the data retention operation as PE cycles are accumulated helps maintain the reduction in the Vth width and avoid an undesirable increase in the Vth width.

Figure 11A:
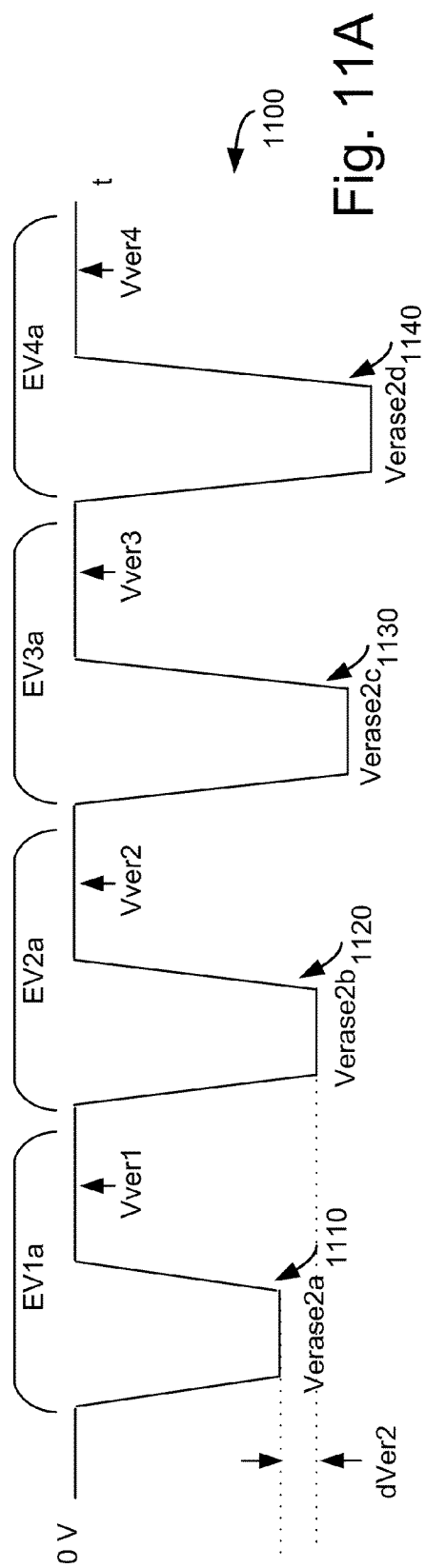
FIG. 11A depicts a waveform in an example erase operation which uses an increasingly negative control gate voltage, consistent with step 700 of FIG. 7A.

FIG. 11A depicts a waveform in an example erase operation which uses an increasingly negative control gate voltage, consistent with step 700 of FIG. 7A. This erase operation involves a negative control gate voltage which increases in magnitude in each erase-verify iteration (e.g., EV1a, EV2a, EV3a and EV4a). The waveform 1100 depicts a series of negative control gate voltages 1110, 1120, 1130 and 1140 with magnitudes of Verase2a, Verase2b, Verase2c and Verase2d, respectively, which step up in magnitude by dVer2 in each erase-verify iteration. Each erase-verify iteration EV1a, EV2a, EV3a and EV4a is followed by a verify test Vver1, Vver2, Vver3 or Vver4, respectively.

Figure 11B:
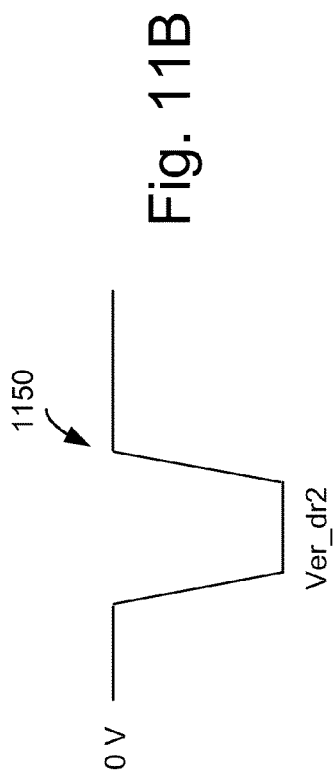
FIG. 11B depicts a waveform in an example data retention operation which uses a negative control gate voltage, consistent with step 705 of FIG. 7A.

FIG. 11B depicts a waveform in an example data retention operation which uses a negative control gate voltage, consistent with step 705 of FIG. 7A. The vertical axis depicts voltage and the horizontal axis depicts time. A waveform 1150 depicts a control gate voltage of Ver_dr2. The magnitude of the control gate voltage for the data retention operation can be optimized to provide an optimum reduction in the Vth width, as discussed.

Figure 12:
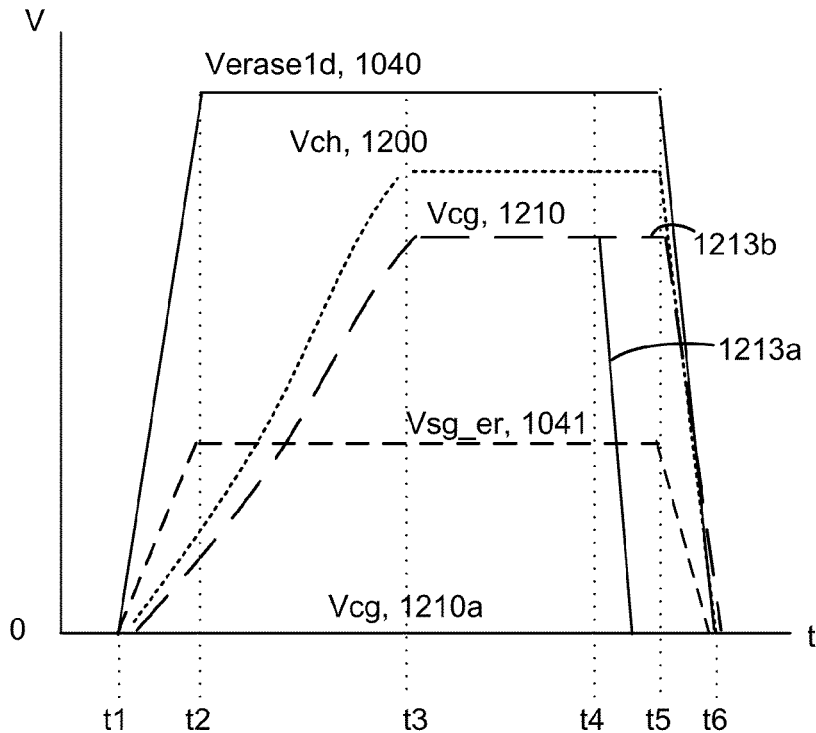
FIG. 12 depicts a detailed view of the waveforms 1040 and 1041 of FIG. 10A in addition to a waveform 1200 which represents a voltage of a channel of a NAND string, and a waveform 1210 or 1210a which represent a voltage of a control gate of a memory cell.

FIG. 12 depicts a detailed view of the waveforms 1040 and 1041 of FIG. 10A in addition to a waveform 1200 which represents a voltage of a channel of a NAND string, and a waveform 1210 or 1210a which represent a voltage of a control gate of a memory cell. The horizontal axis depicts time and the vertical axis depicts voltage. Before t1, the waveforms are at 0 V. From t1-t2, the bit line and/or source line voltage is increased to a peak level (Verase1d), and the select gate waveform is increased to a peak level (Vsg_er). At this time, GIDL begins to occur in proportion to the drain-to-gate voltage (Verase1d-Vsg_er) of the select gate transistors. Between t2 and t3, the channel continues to charge up (waveform 1200), and remains at a peak charged level from t3-t4. Vcg (waveform 1210) is floating, in one approach, so that it is coupled up by Vch to a level which is slightly below Vch.

For the selected word lines, waveform portion 1213a indicates that the word line voltage is driven lower, e.g., to 0 V, driving electrons out of the charge-trapping layer and into the channel, thus erasing the associated memory cells. For the unselected word lines, if any, waveform portion 1213b indicates that the word line voltage remains floating so that no erasing occurs for the associated memory cells. Between t5 and t6, the select gate waveform and the erase voltage waveform are reduced to 0 V. Vch and Vcg follow to 0 V.

In another possible approach, Vcg is fixed at 0 V or another voltage while Vch increases. This approach also results in an erase effect although not as strong as when Vch is floated and then grounded. Other variations are possible as well.

Figure 13:
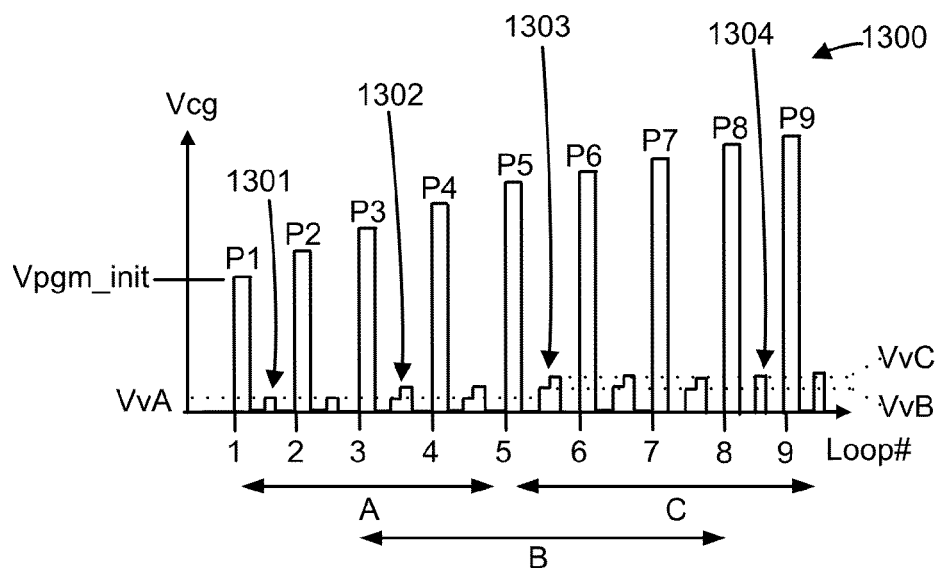
FIG. 13 depicts voltages applied to a word line in an example programming operation, consistent with step 702 of FIG. 7A.

FIG. 13 depicts voltages applied to a word line in an example programming operation, consistent with step 702 of FIG. 7A. The horizontal axis depicts time or program loops and the vertical axis depicts Vcg, the voltage on an nth word line which is selected for programming. The programming pass comprises a series of waveforms 1300. Incremental step pulse programming is performed for each target data state. This example also performs verify tests based on the program loop. For example, the A, B and C state cells are verified in loops 1-4, 3-7 and 5-9, respectively. An example verify waveform 1301 comprises an A state verify voltage at VvA. An example verify waveform 1302 comprises A and B state verify voltages at VvA and VvB, respectively. An example verify waveform 1303 comprises B and C state verify voltages at VvB and VvC, respectively. An example verify waveform 1304 comprises a C state verify voltage at VvC. The program pulses P1, P2, P3, P4, P5, P6, P7, P8 and P9 are also depicted.

Accordingly, it can be seen that, in one embodiment, a method for operating a memory device comprises: performing a programming operation involving a set of memory cells, each memory cell of the set of memory cells comprises a charge-trapping layer a control gate, a drain, a source and a channel, and the performing the programming operation comprises configuring the memory cells to provide a positive gate-to-channel voltage for the memory cells, the configuring the memory cells to provide the positive gate-to-channel voltage comprises applying a program voltage to the control gates of the memory cells; and in response to completion of the programming operation, performing a data retention operation which configures the memory cells to provide a negative gate-to-channel voltage for the memory cells.

In another embodiment, a memory device comprises: a set of memory cells, each memory cell of the set of memory cells comprises a charge-trapping layer; a set of word lines, the memory cells are connected to different word lines of the set of word lines; and a control circuit. The control circuit configured to: perform an erase operation for the set of memory cells using an erase voltage, the erase operation provides a negative gate-to-channel voltage for the memory cells, after the erase operation, perform a programming operation for the set of memory cells using a program voltage, the programming operation provides a positive gate-to-channel voltage for the memory cells, and after the programming operation, perform a data retention operation using a weak erase voltage, weaker than the erase voltage of the erase operation, the data retention operation provide a negative gate-to-channel voltage for the memory cells which is configured to increase a data retention of the memory cells.

In another embodiment, a memory controller comprises: a storage device comprising a set of instructions, and a processor operable to execute the set of instructions. The set of instructions comprises: instructions to perform a programming operation involving a set of memory cells, each memory cell of the set of memory cells comprises a charge-trapping layer and the performing the programming operation comprises providing a positive gate-to-channel voltage for the memory cells; instructions to detect completion of the programming operation; and instructions, responsive to the instructions to detect the completion of the programming operation, to provide a negative gate-to-channel voltage for the memory cells.

In another embodiment, a memory device comprises: a set of memory cells, each memory cell of the set of memory cells comprises a charge-trapping layer and a plurality of terminals, the plurality of terminals comprise a control gate, a drain, a source and a channel; and a control circuit. The control circuit is configured to: perform a programming operation involving the set of memory cells, the programming operation configures the memory cells to provide a positive gate-to-channel voltage for the memory cells, and the memory cells are configured to provide the positive gate-to-channel voltage by applying a program voltage to the control gates of the memory cells, and in response to completion of the programming operation, provide a data retention operation which configures the memory cells to provide a negative gate-to-channel voltage for the memory cells.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a memory device, comprising:
performing a programming operation involving a set of memory cells, each memory cell of the set of memory cells comprises a charge-trapping layer, a control gate, a drain, a source and a channel, and the performing the programming operation comprises configuring the memory cells to provide a positive gate-to-channel voltage for the memory cells, the configuring the memory cells to provide the positive gate-to-channel voltage comprises applying a program voltage to the control gates of the memory cells;
in response to completion of the programming operation, performing a data retention operation which configures the memory cells to provide a negative gate-to-channel voltage for the memory cells; wherein:
the memory cells are in NAND strings;
the NAND strings comprise drain-side select gate transistors; and
the configuring the memory cells to provide the negative gate-to-channel voltage comprises applying a drain voltage to drains of the drain-side select gate transistors and a control gate voltage to control gates of the drain-side select gate transistors which cause the drain-side select gate transistors to charge up the channels by gate-induced drain leakage; and
performing an erase operation for the set of memory cells, the performing the erase operation comprises applying a drain voltage to the drains of the drain-side select gate transistors and a control gate voltage to the control gates of the drain-side select gate transistors which cause the drain-side select gate transistors to charge up the channels by gate-induced drain leakage, wherein the drain voltage applied to the drains of the drain-side select gate transistors in the data retention operation is lower than the drain voltage applied to the drains of the drain-side select gate transistors in the erase operation.

2. The method of claim 1, wherein:
the channels of the memory cells extend in vertical pillars.

3. The method of claim 1, wherein:
the drain voltage applied to the drains of the drain-side select gate transistors in the data retention operation is 30-70% of the drain voltage applied to the drains of the drain-side select gate transistors in the erase operation.

4. The method of claim 1, wherein:
the drain voltage applied to the drains of the drain-side select gate transistors in the erase operation is stepped up in magnitude using incremental step pulse erasing, starting from an initial voltage and ending at a final voltage; and
the drain voltage applied to the drains of the drain-side select gate transistors in the data retention operation is 30-70% of the final voltage.

5. The method of claim 1, wherein:
the memory cells are connected to different word lines in the memory device;
the completion of the programming operation occurs when programming is completed for the memory cells connected to the different word lines; and
the data retention operation is performed concurrently for the memory cells connected to the different word lines.

6. The method of claim 1, wherein:
the memory cells are connected to different word lines in a block;
the completion of the programming operation occurs when programming is completed for the block; and
the data retention operation is performed concurrently for the memory cells connected to the different word lines.

7. The method of claim 1, wherein:
a magnitude of the negative gate-to-channel voltage is relatively smaller when a number of program-erase cycles in the memory device is relatively larger.

8. The method of claim 1, wherein:
the configuring the memory cells to provide the positive gate-to-channel voltage comprises repeatedly applying the program voltage to the control gates of the memory cells using incremental step pulse programming.

9. A memory device, comprising:
a set of memory cells, each memory cell of the set of memory cells comprises a charge-trapping layer;
a set of word lines, the memory cells are connected to different word lines of the set of word lines; and
a control circuit, the control circuit configured to:
perform an erase operation for the set of memory cells using an erase voltage, the erase operation provides a negative gate-to-channel voltage for the memory cells, after the erase operation, perform a programming operation for the set of memory cells using a program voltage, the programming operation provides a positive gate-to-channel voltage for the memory cells, and after the programming operation, perform a data retention operation using a weak erase voltage, weaker than the erase voltage of the erase operation, the data retention operation provide a negative gate-to-channel voltage for the memory cells which is configured to increase a data retention of the memory cells, wherein:

the control circuit, to provide the negative gate-to-channel voltage during the erase operation, is configured to ground control gate voltages for the memory cells while boosting channels of the memory cells;

the control circuit, to provide the negative gate-to-channel voltage during the data retention operation, is configured to ground the control gate voltages for the memory cells while boosting channels of the memory cells; and the channels are boosted to a higher level during the erase operation than during the data retention operation.

10. The memory device of claim 9, wherein:
a magnitude of the weak erase voltage is less than 30-70% of a magnitude of the erase voltage of the erase operation.

11. The memory device of claim 9, wherein:
the erase operation uses a plurality of erase voltages, starting from an initial voltage and ending at a final voltage, wherein the weak erase voltage is less than 30-70% of a magnitude of the final voltage of the erase operation.

12. The memory device of claim 9, wherein:
each memory cell of the set of memory cells comprises a tunneling layer adjacent to the charge-trapping layer and a channel layer adjacent to the charge-trapping layer; and
the tunneling layer comprises oxide-nitride-oxide.

13. The memory device of claim 9, wherein:
the control circuit is configured to boost the channels of the memory cells by gate-induced drain leakage during the erase operation and during the data retention operation.

14. The memory device of claim 9, wherein:
the control circuit, to provide the negative gate-to-channel voltage during the erase operation, is configured to provide negative control gate voltages for the memory cells while grounding channels of the memory cells;
the control circuit, to provide the negative gate-to-channel voltage during the data retention operation, is configured to provide negative control gate voltages for the memory cells while grounding the channels of the memory cells; and
a magnitude of the negative control gate voltage during the erase operation is greater than a magnitude of the negative control gate voltage during the data retention operation.

15. A method for operating a memory device, comprising:
performing a programming operation involving a set of memory cells, each memory cell of the set of memory cells comprises a charge-trapping layer, a control gate, a drain, a source and a channel, and the performing the programming operation comprises configuring the memory cells to provide a positive gate-to-channel voltage for the memory cells, the configuring the memory cells to provide the positive gate-to-channel voltage comprises applying a program voltage to the control gates of the memory cells; and in response to completion of the programming operation, performing a data retention operation which configures the memory cells to provide a negative gate-to-channel voltage for the memory cells, wherein:

the memory cells are arranged along vertically-extending memory holes in the memory device;

a width of the vertically-extending memory holes varies along a height of the memory device; and the data retention operation is performed for a subset of the memory cells in a first range of heights in the memory device separately from a subset of the memory cells in a second range of heights in the memory device.

16. A memory device, comprising:
a set of memory cells, each memory cell of the set of memory cells comprises a charge-trapping layer;
a set of word lines, the memory cells are connected to different word lines of the set of word lines;
means for performing an erase operation for the set of memory cells using an erase voltage, the means for performing the erase operation comprises means for providing a negative gate-to-channel voltage for the memory cells and grounding control gate voltages for the memory cells while boosting channels of the memory cells;
means for, after the erase operation, performing a programming operation for the set of memory cells using a program voltage, the means for performing the programming operation comprises means for providing a positive gate-to-channel voltage for the memory cells; and
means for, after the programming operation, performing a data retention operation using a weak erase voltage, weaker than the erase voltage of the erase operation, the means for performing the data retention operation comprises means for providing a negative gate-to-channel voltage for the memory cells and for grounding the control gate voltages for the memory cells while boosting channels of the memory cells, wherein the channels are boosted to a higher level during the erase operation than during the data retention operation.

17. The memory device of claim 16, wherein:
the negative gate-to-channel voltage for the memory cells in the data retention operation is configured to increase a data retention of the memory cells.

18. The memory device of claim 16, wherein:
a magnitude of the weak erase voltage is less than 30-70% of a magnitude of the erase voltage of the erase operation.

19. The memory device of claim 16, wherein:
the erase operation uses a plurality of erase voltages, starting from an initial voltage and ending at a final voltage, wherein the weak erase voltage is less than 30-70% of a magnitude of the final voltage of the erase operation.

20. The memory device of claim 16, wherein:
each memory cell of the set of memory cells comprises a tunneling layer adjacent to the charge-trapping layer and a channel layer adjacent to the charge-trapping layer; and
the tunneling layer comprises oxide-nitride-oxide.

21. The memory device of claim 16, wherein:
the means for performing the erase operation and the means for performing the data retention operation boost the channels of the memory cells using gate-induced drain leakage.

* * * * *